United States Patent
Nishiyama

(10) Patent No.: US 7,881,038 B2
(45) Date of Patent: Feb. 1, 2011

(54) VARIABLE CAPACITOR, VARIABLE CAPACITOR APPARATUS, HIGH FREQUENCY CIRCUIT FILTER, AND HIGH FREQUENCY CIRCUIT

(75) Inventor: Madoka Nishiyama, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/457,698

(22) Filed: Jun. 18, 2009

(65) Prior Publication Data

US 2009/0323252 A1 Dec. 31, 2009

Related U.S. Application Data

(63) Continuation of application No. PCT/JP2007/074046, filed on Dec. 13, 2007.

(30) Foreign Application Priority Data

Dec. 21, 2006 (JP) ............................. 2006-343991

(51) Int. Cl.
*H01G 5/00* (2006.01)

(52) U.S. Cl. ................ 361/277; 361/272; 361/273; 361/278; 361/279; 361/290

(58) Field of Classification Search ............... 361/277, 361/278–279, 272–273, 283.1, 283.2, 290–292, 361/283.3
See application file for complete search history.

(56) References Cited

U.S. PATENT DOCUMENTS 6,593,672 B2   7/2003  Ma et al.
6,909,589 B2 *  6/2005  Huff ............................. 361/281
6,970,340 B2 * 11/2005  Nakayama .................... 361/277
7,054,132 B2 *  5/2006  Yoshida et al. ............... 361/277
7,082,024 B2 *  7/2006  Casset et al. ................. 361/277

(Continued)

FOREIGN PATENT DOCUMENTS

JP           9-199376            7/1997

(Continued)

OTHER PUBLICATIONS

Darrin J. Young, et al., "A Micromachined Variable Capacitor for Monolithic Low-Noise VCOS," Solid-State Sensor and Actuator Workshop, Hilton Head, South Carolina, Jun. 2-6, 1996, (pp. 86-89).

(Continued)

*Primary Examiner*—Nguyen T Ha
(74) *Attorney, Agent, or Firm*—Staas & Halsey LLP

(57) ABSTRACT

A variable capacitor including a first electrode part, which is provided at a fixed part that includes a substrate, and a movable part, which has a second electrode part forming the capacity of said variable capacitor between itself and the first electrode part, and the movable part is displaced in response to a first drive signal to selectively go into an opposing status, in which the second electrode part opposes the first electrode part, and a non-opposing status, in which the second electrode part essentially does not oppose the first electrode part. This variable capacitor is able to obtain at least a two-value capacity in which the mutual ratio is large without specially requiring another capacitor or a switch, and it is able to obtain the desired capacity variation range by combining a plurality of capacitors.

26 Claims, 18 Drawing Sheets

U.S. PATENT DOCUMENTS

| | | |
|---|---|---|
| 7,180,145 B2 * | 2/2007 | Musalem et al. ............ 257/415 |
| 7,200,908 B2 * | 4/2007 | Cassett et al. .............. 29/25.42 |
| 2004/0031912 A1 | 2/2004 | Wong |
| 2005/0057885 A1 | 3/2005 | Wong |

FOREIGN PATENT DOCUMENTS

| | | |
|---|---|---|
| JP | 2003-209027 | 7/2003 |
| JP | 2003-243254 | 8/2003 |

OTHER PUBLICATIONS

International Search Report (PCT/ISA/210) for International Application No. PCT/JP2007/074046, mailed Feb. 26, 2008.

* cited by examiner

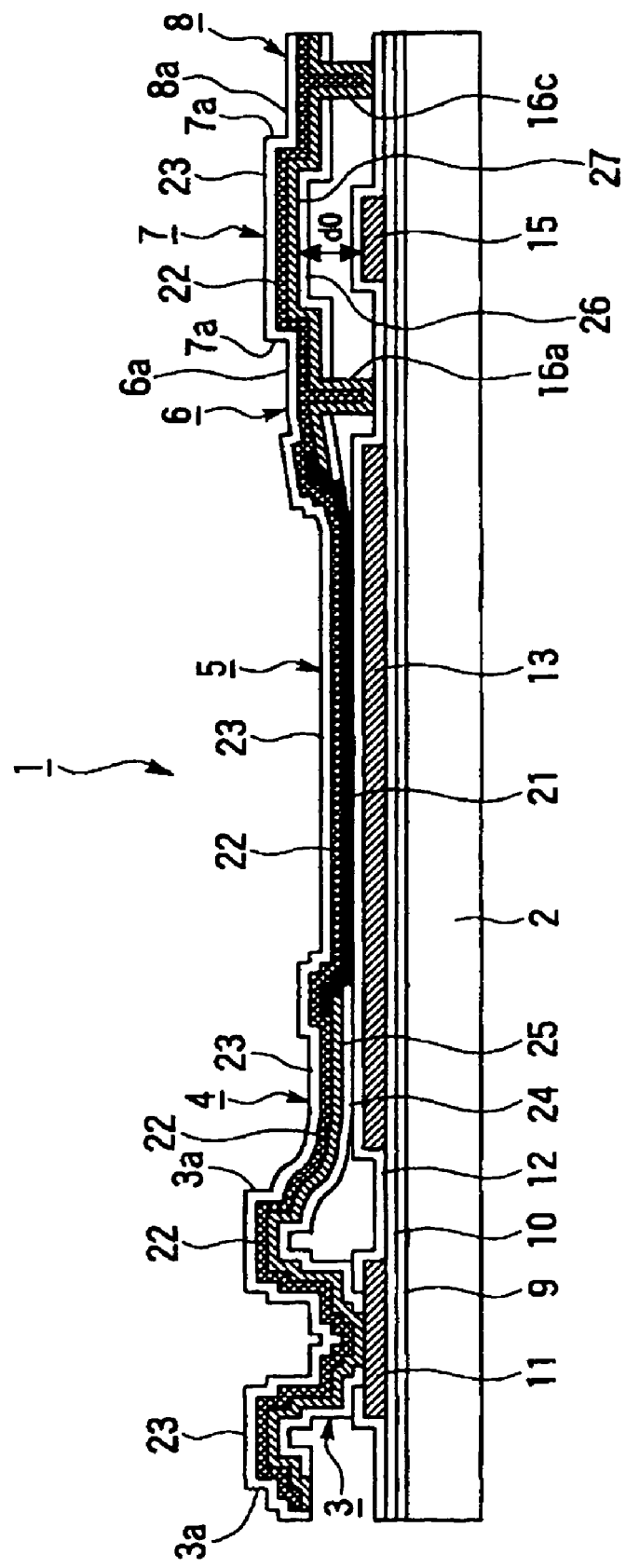

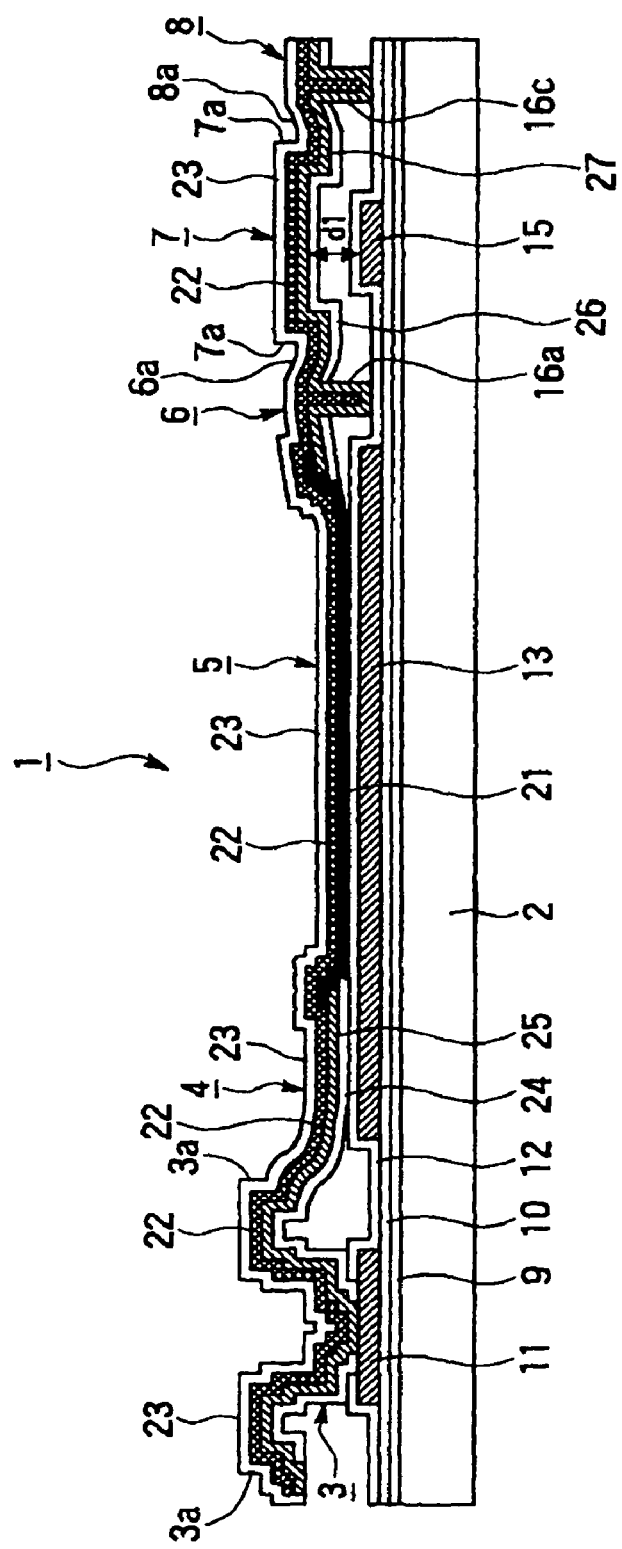

VARIABLE CAPACITOR, VARIABLE CAPACITOR APPARATUS, HIGH FREQUENCY CIRCUIT FILTER, AND HIGH FREQUENCY CIRCUIT

CROSS-REFERENCE TO RELATED APPLICATIONS

This application is a continuing application, filed under 35 U.S.C. §111(a), of International Application PCT/JP2007/074046, filed Dec. 13, 2007, it being further noted that priority is based upon Japanese Patent Application 2006-343991, filed Dec. 21, 2006.

BACKGROUND OF THE INVENTION

1. Field of the Invention

The present invention relates to a variable capacitor, a variable capacitor apparatus that uses this, a high frequency circuit filter, and a high frequency circuit. The variable capacitor and the variable capacitor apparatus can be used in, for example, wireless communication apparatuses or RF measurement apparatuses, etc.

2. Description of the Related Art

In the development of wireless communication technology such as portable telephones, the need for variable capacitors used in high frequency circuits, etc. is growing. Conventionally, a varactor, which is a semiconductor device, has been used as such a variable capacitor, but the Q value thereof is small, which brings about various nonconformities.

A variable capacitor that uses a MEMS (microelectromechanical system) has been proposed by Darrin J. Young and Bernhard E. Boser, "A Micromachined Variable Capacitor for Monolithic Low-noise VCOs," Solid-State and Actuator Workshop, Hilton Head, June 1996, pp 86-89 (hereinafter "Young et al."). This variable capacitor comprises a fixed electrode and a movable electrode arranged so as to form a parallel flat plate. The movable part is supported by a support part so as to be able to move with respect to the fixed electrode so that the gap between the two electrodes changes and so that a spring force by which the gap between the two electrodes attempts to return to the position at which the prescribed gap (initial gap) results is generated. The two electrodes act as both a capacity electrode for forming the capacity of the variable capacitor and a drive electrode for adjusting the gap between the two by generating electrostatic force that opposes the spring force.

However, in the variable capacitor disclosed above, the ratio of the maximum capacity value with respect to the minimum capacity value that can be obtained by variation could not be made very large. The reason for this will be described below.

In the variable capacitor disclosed above, the variable electrode stops at a position at which the electrostatic force between the fixed electrode and the movable electrode and the spring force are in balance. The spring force is proportional to the amount that the gap between the two electrodes has changed from the initial gap. On the other hand, the electrostatic force is proportional to square of the voltage between the two electrodes and is inversely proportional to square of the gap between the two electrodes.

Therefore, when the voltage between the two electrodes is increased, from when the gap between the two electrodes is at the initial gap until it becomes ⅓ of that gap, the spring force and the electrostatic force stabilize and become balanced, and the movable electrode stabilizes and stops at an electrode gap corresponding to the applied voltage. On the other hand, when the voltage between the two electrodes is increased, and the gap between the two electrodes narrows beyond a gap that is ⅓ of the initial gap, it is not possible for the spring force and the electrostatic force to stabilize and become balanced, and even if the voltage between the two electrodes were not further increased, the electrostatic force would exceed the spring force at any position at which the gap between the two electrodes is narrower than a ⅓ gap. For this reason, when a voltage that is larger than a voltage that would result in the gap between the two electrodes becoming a gap that is ⅓ of the initial gap is applied, regardless of the magnitude of that voltage, a so-called pull-in phenomenon occurs, in which the movable electrode approaches the fixed electrode up to the limit.

For this reason, the range of the gap between the two electrodes that can be continuously adjusted by means of a voltage applied between the two electrodes (continuous adjustment range) is limited to a range from the initial gap to ⅓ of that gap. Therefore, in the variable capacitor disclosed above, only variation from the capacity value at the time of the initial gap up to a capacity value that was 1.5 times that capacity value was possible.

Therefore, Japanese Unexamined Patent Application Publication No. H9-199376 and U.S. Pat. No. 6,593,672 propose a variable capacitor apparatus that makes it possible to obtain the desired capacity variation range, such as by widening the capacity variation range, and that combines a plurality of fixed or variable capacitors and a switch that is specially provided in addition thereto.

The variable capacitor apparatus disclosed in Japanese Unexamined Patent Application Publication No. H9-199376 (in Japanese Unexamined Patent Application Publication No. H9-199376, called a "variable capacity condenser") comprises first through third fixed capacitors comprising two opposing electrodes leaving a space and first and second MEMS switches. In addition, a series circuit of a first fixed capacitor (the capacity thereof is C1), a second fixed capacitor (the capacity thereof is C2) and a first MEMS switch and a series circuit of a third fixed capacitor (the capacity thereof is C3) and a second MEMS switch are mutually connected in parallel. According to this variable capacitor apparatus, it is possible to vary the obtained compound capacity to the respective capacity values of C1, C1+C2 and C1+C2+C3 by means of the ON-OFF statuses of the first and second MEMS switches.

The variable capacitor apparatus disclosed in U.S. Pat. No. 6,593,672 comprises plurally connecting, in parallel, series circuits of MEMS capacitors and MEMS switches as the variable capacitors. According to this variable capacitor apparatus as well, it is possible to vary the compound capacity obtained to various values by varying the ON-OFF statuses of the respective MEMS switches. The variable capacitor itself used in the variable capacitor apparatus of U.S. Pat. No. 6,593,672 is similar to the variable capacitor disclosed in Young et al.

However, in the conventional variable capacitor apparatus such as discussed above, a special switch was required in addition to the fixed or variable capacitor, so the occupied area increased, the Q value decreased due to contact resistance between the switch contact points or the Q value decreased due to the resistance of the wiring that connects the capacitor and the switch.

In addition, depending on the application, obtaining only a two-value capacity may be sufficient, but there are also cases in which it is necessary for the ratio of two capacity values to be large. However, in the variable capacitor disclosed in Young et al. and the variable capacitor itself used in the variable capacitor apparatus disclosed in U.S. Pat. No. 6,593, 672, for reasons such as those discussed above, it was not possible to obtain a two-value capacity with a large mutual ratio. Therefore, for example, connecting in parallel a series circuit of a first fixed capacitor, which has an adequately small capacity value, a second capacitor, which has a relatively large capacity value, and a switch is conceivable. In this case, while it is possible to obtain an adequately small capacity value by turning the switch off, it is possible to obtain a relatively large capacity value by turning the switch on, and it is possible to obtain a two-value capacity with a large mutual ratio. However, in this case, in requiring two fixed capacitors, a special switch is required, so an increase in the occupied area and a decrease in the Q value are unfortunately brought about.

SUMMARY OF THE INVENTION

The present invention was devised taking such circumstances into account, and an aspect thereof is to provide a variable capacitor apparatus that, in addition to being able to obtain the desired capacity variation range by combining a plurality of capacitors, is able to decrease the number of or eliminate switches specially required in comparison to the conventional variable capacitor apparatus, as well as a variable capacitor that can be used therein.

In addition, the present invention has an aspect of providing a variable capacitor that is able to at least obtain a two-value capacity with a large mutual ratio without specially requiring another capacitor and switch.

In addition, the present invention has an aspect of providing a high frequency circuit filter and a high frequency circuit that use the variable capacitor apparatus and the variable capacitor.

Additional aspects and/or advantages of the invention will be set forth in part in the description which follows and, in part, will be apparent from the description, or may be learned by practice of the invention.

The foregoing and/or other aspects are achieved by providing a variable capacitor comprising a first electrode part, which is provided on a fixed part that includes a substrate, a movable part, which has a second electrode part which forms the capacity of the variable capacitor between itself and the first electrode part, and the movable part is displaced in response to a first drive signal to selectively go into an opposing status, in which the second electrode part opposes the first electrode part, and a non-opposing status, in which the second electrode part essentially does not oppose the first electrode part.

According to an aspect, the movable part may be a thin film.

According to an aspect, the capacity in the non-opposing status may be nearly 0.

According to an aspect, the capacity in the opposing status may be 10 times or more the capacity in the non-opposing status. The magnification thereof may be, for example, 100 times or more or may be 1000 times or more.

According to an aspect, the movable part may have a cantilever beam structure, which has a fixed end fixed to the fixed part, and the second electrode part may be arranged at the front end side of the movable part.

According to an aspect, the first electrode part may form a part of the high frequency signal line, and, in a plan view as seen from the normal line direction of the principal surface of the substrate, the direction from the fixed end side toward the front end side may be approximately orthogonal to the direction in which the high frequency signal line extends.

According to an aspect, the movable part may have a curved part, which is arranged between the second electrode part and the fixed end, and a linear part, which is arranged between the curved part and the fix end, the curved part, in a status in which driving force is not being applied to the movable part, curves so as to bend up from the fixed part side from the fixed end side toward the front end side due to its own stress, and the linear part, in a status in which driving force is not being applied to the movable part, extends in a direction approximately parallel to the principal plane of the substrate from the fix end side toward the front end side in a status in which a gap has been opened up from the fixed part due to its own stress, and, in a status in which driving force is not being applied to the movable part, goes into a non-opposing status.

According to an aspect, the fixed part may have a third electrode part at a location that corresponds to at least a part of the linear part and at least a part of the curved part, and the movable part may have a fourth electrode part at the linear part and the curved part, and an electrostatic force, which acts between the third and fourth electrode parts by means of a drive voltage being applied between the third and fourth electrode parts as the first drive signal, is applied to the movable part as the driving force according to the first drive signal, and when a driving force of a prescribed strength or more according to the first drive signal is applied to the movable part, by means of said driving force, at least a part of the linear part and at least a part of the curved part are pulled in to the fixed part side and go into the opposing status.

According to an aspect, the second electrode part and the fourth electrode part may be electrically connected.

According to an aspect, the first electrode part and the third electrode part may be electrically separated.

According to an aspect, the substrate may be a circuit substrate on which a complementary metal-oxide-semiconductor (CMOS) part has been equipped.

According to an aspect, the movable part, in the opposing status, may be partially displaced in response to a second drive signal so that the gap between at least a part of the first electrode part and the second electrode part changes.

According to an aspect, a support protrusion that comes into contact with the fixed part or the movable part in the opposing status may be provided at a location in the vicinity of the second electrode of the movable part or at a location of the fixed part corresponding to that location so that a portion of the vicinity of the second electrode of the movable part is supported by means of the fixed part in the opposing status.

According to an aspect, a portion in the vicinity of the second electrode of the movable part may be supported in a double-supported status via the support protrusion by means of a fixed part in the opposing status.

According to an aspect, an electrostatic force, which acts between the first and second electrode parts by means of a direct current bias voltage being applied between the first and second electrode parts as the second drive signal, may be applied to the movable part as the driving force according to the second drive signal.

It is another aspect to provide a variable capacitor apparatus including a plurality of capacitors that are electrically connected so that a compound capacity resulting from the capacities of said plurality of capacitors being combined is obtained, where at least one of the capacitors of the plurality of capacitors is a variable capacitor according to the present invention.

According to an aspect, the plurality of capacitors may be connected in parallel.

According to an aspect, two or more capacitors of the plurality of capacitors may be variable capacitors according to the present invention and may be able to supply the first drive signal respectively independently to said two or more variable capacitors.

According to an aspect, the respective two or more capacitors of the plurality of capacitors may be variable capacitors according to the present invention, and, in at least one of the variable capacitors from among said two or more variable capacitors and at least another one of the variable capacitors from among said two or more variable capacitors, the opposition areas of the first and second electrode parts in the opposing status differ.

According to an aspect, the respective two or more capacitors of the plurality of capacitors may be variable capacitors according to the present invention and comprise a drive circuit that respectively supplies the first drive signal to said two or more variable capacitors in response to a command signal.

According to an aspect, the respective two or more capacitors of the plurality of capacitors may be variable capacitors according to the present invention where in at least one of the variable capacitors from among said two or more variable capacitors and at least another one of the variable capacitors from among said two or more variable capacitors, so that the sensitivity of the second drive signal with respect to changes in the gap between at least a part of the first electrode part and the second electrode part in the opposing status varies.

It is another aspect to provide a high frequency circuit filter including a variable capacitor according to the present invention or a variable capacitor apparatus according to the present invention.

As described above, according to the present invention, it is possible to provide a variable capacitor apparatus that is able to obtain the desired capacity variation range by combining a plurality of capacitors and is also able to reduce the number of or eliminate specially required switches in comparison with a conventional variable capacitor apparatus, as well as to a variable capacitor that can be used therein.

In addition, according to the present invention, it is possible to provide a variable capacitor that is able to obtain at least a two-value capacity whose mutual ratio is large without specially requiring other capacitors and switches.

Moreover, according to the present invention it is possible to provide a high frequency circuit filter and a high frequency circuit that use the variable capacitor apparatus and the variable capacitor.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 5 is a schematic cross-sectional view that shows another operation status of a variable capacitor according to the first embodiment of the present invention;

FIG. 6 is a schematic cross-sectional view that shows yet another operating status of a variable capacitor according to the first embodiment of the present invention;

DETAILED DESCRIPTION OF THE PREFERRED EMBODIMENTS

Figure 1:
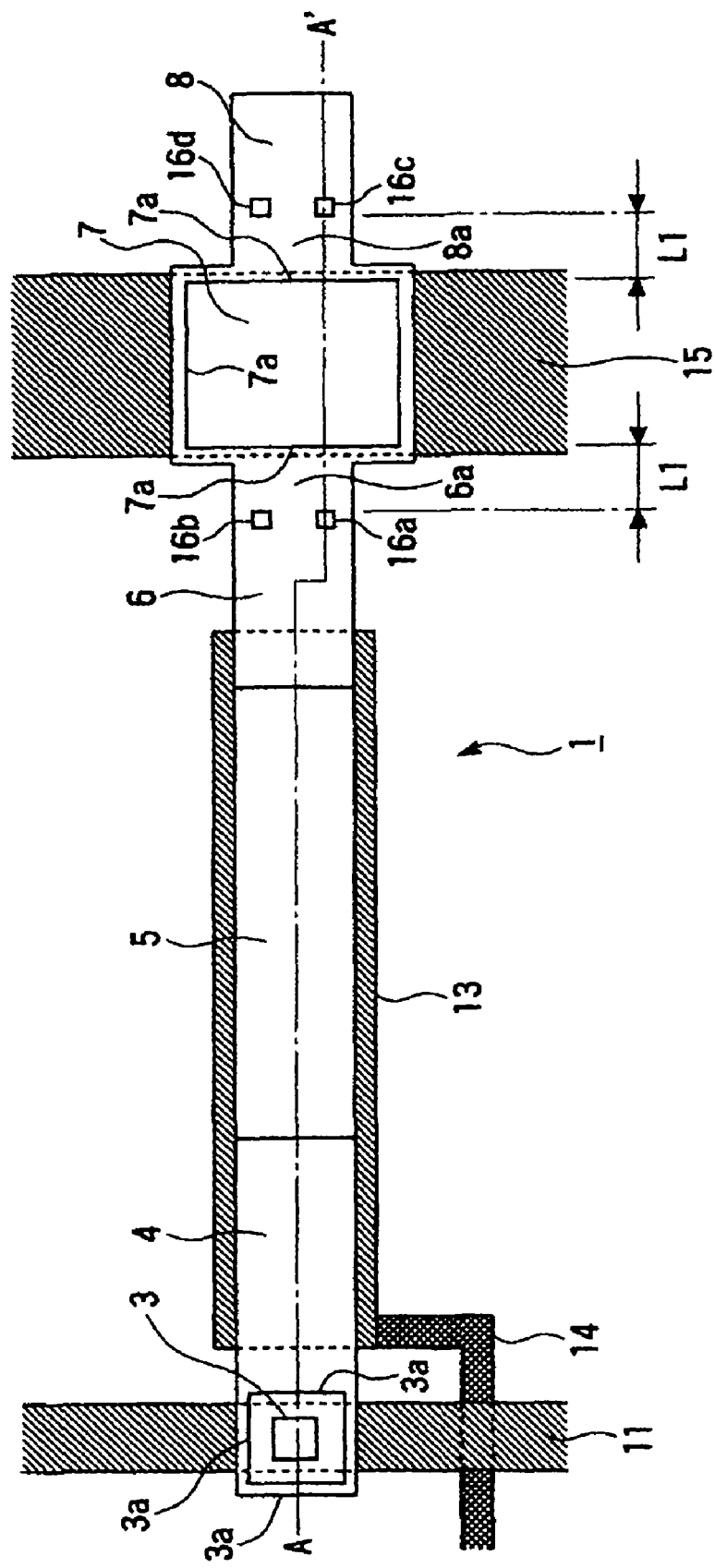
FIG. 1 is a schematic plan view that schematically shows a variable capacitor according to the first embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

A variable capacitor, a variable capacitor apparatus, a high frequency circuit filter, and a high frequency circuit according to the present invention will be described below while referring to drawings.

Figure 2:
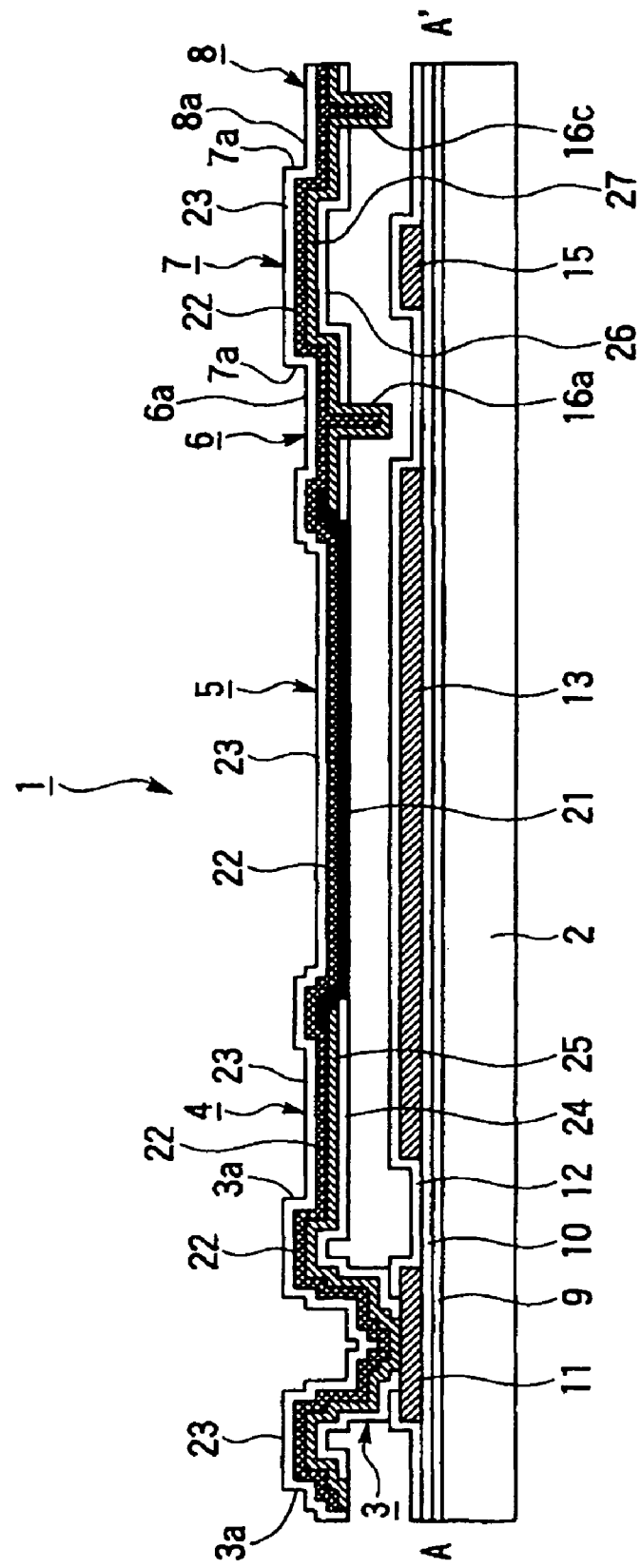
FIG. 2 is a schematic cross-sectional view along the A-A line in FIG. 1.
Figure 3:
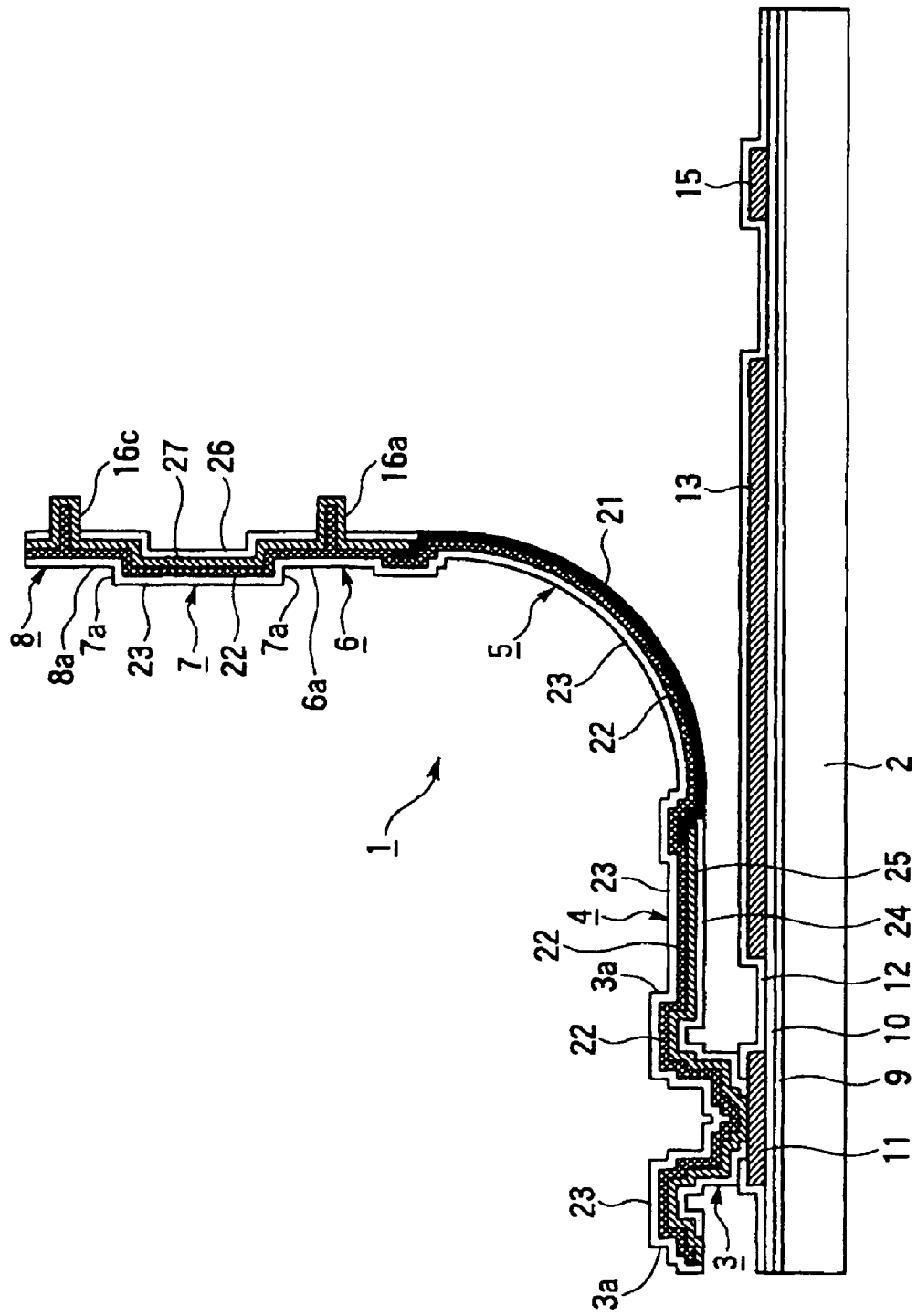
FIG. 3 is a schematic cross-sectional view that shows an operation status of a variable capacitor according to the first embodiment of the present invention.
Figure 4:
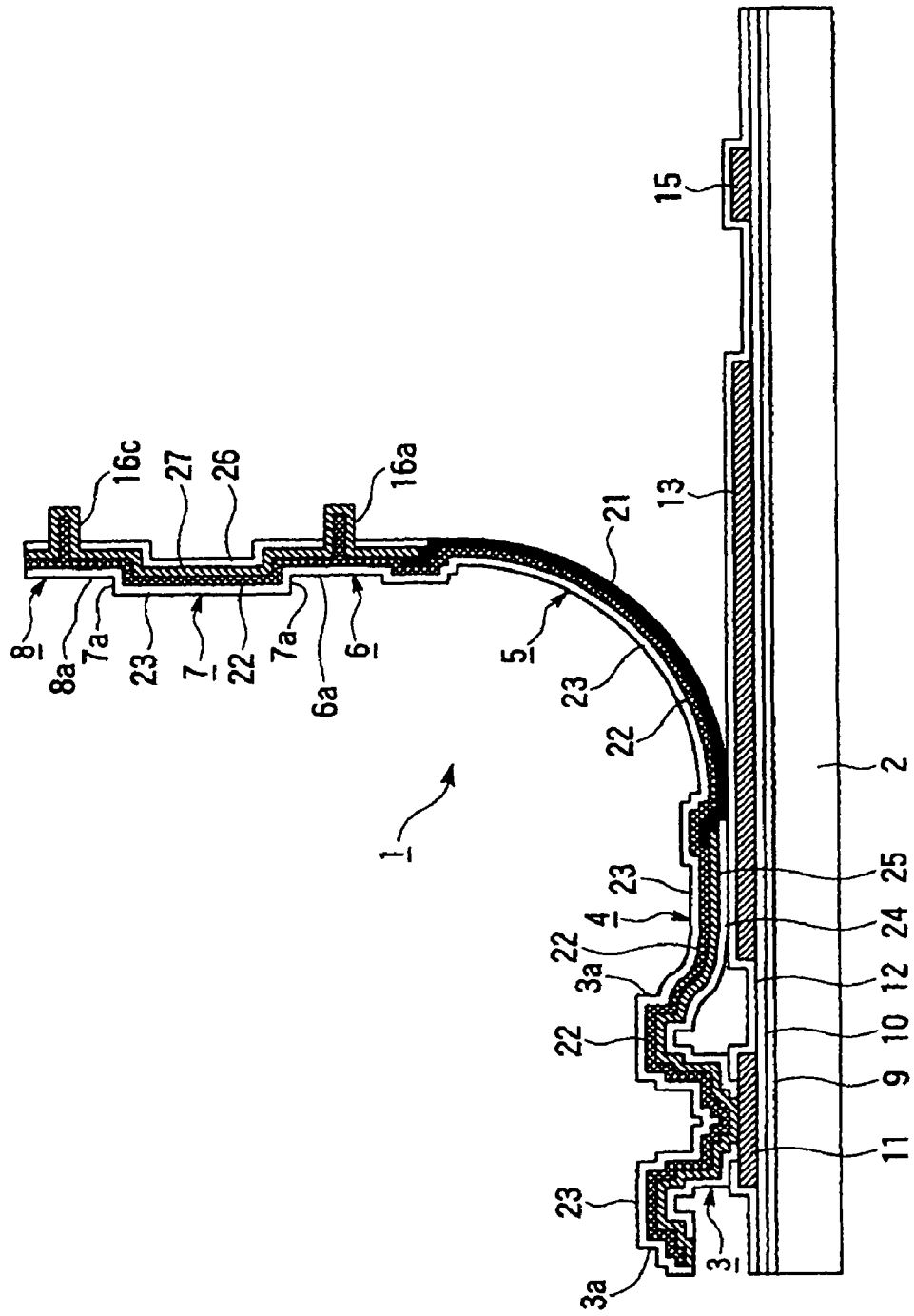
FIG. 4 is a schematic cross-sectional view that shows a status transition process of a variable capacitor according to the first embodiment of the present invention.

FIG. 1 is a schematic plan view that schematically shows a variable capacitor 1 according to the first embodiment of the present invention. FIG. 2 is a schematic cross-sectional view along the A-A' line of FIG. 1. Where, FIG. 1 and FIG. 2 show a status prior to removing the sacrificial layers such as sacrificial layers 31~33 in the course of manufacturing a variable capacitor 1 according to the present embodiment. Sacrificial layers such as sacrificial layers 31~33 have been omitted in FIG. 1 and FIG. 2, so refer to FIG. 9b to be discussed below. Note that, in order to facilitate understanding, in FIG. 1, drawings of films 10 and 12, etc. have been omitted, and hatching has been added to wiring patterns 11, 14 and 15 and the ON driving fixed electrode 13. In FIG. 1, support protrusions 16a~16d, though normally shown by a hidden outline, are shown by a solid line for convenience of drawing notation. FIG. 3, FIG. 5 and FIG. 6 are respectively schematic cross-sectional views that show the respective operating statuses of a variable capacitor 1 according to the present embodiment, and they show the same cross section as FIG. 2. FIG. 3 shows a status in which neither the ON driving electrostatic force nor the analog driving electrostatic force to be discussed below is applied, FIG. 5 shows a status in which the ON driving electrostatic force is being applied, but the analog driving electrostatic force in his not being applied, and FIG. 6 shows a status in which both the ON driving electrostatic force and the analog driving electrostatic force are being applied. FIG. 4 is a schematic cross-sectional view that shows the process of transition of variable capacitor 1 according to the present embodiment from the status shown in FIG. 3 to the status shown in FIG. 5, and it shows same cross section as FIG. 2.

Variable capacitor 1 according to the present embodiment comprises a substrate 2 such as the silicon substrate, etc., a leg part 3, a linear part 4, a curved part 5, a linear part 6, a flat plate-shaped plate part 7 and a linear part 8.

The leg part 3 stands up from a substrate 2 via silicon oxide films 9, 10, a wiring pattern 11 comprising an aluminum alloy film, and a silicon oxide film 12, which are sequentially formed on the substrate 2. In the vicinity of the upper part of the leg part 3, a standing part 3a, which constitutes a reinforcing level difference, is formed. The fixed part is comprised by a substrate 2, silicon oxide films 9, 10 and 12, wiring pattern 11 and the ON driving fixed electrode 13 and wiring patterns 14 and 15 to be discussed below.

One end of linear part 4 is mechanically connected to the leg part 3 and becomes the fixed end. Linear part 4, in a status in which driving force (in the present embodiment, ON driving electrostatic force and analog driving electrostatic force) is not being applied, extends approximately parallel to the principal plane of the substrate 2 from the one end side toward the other end side in a status in which a gap has been opened from a fixed part that includes the substrate 2 as shown in FIG. 3 due to its own stress.

At the other end of linear part 4, one end of the curved part 5 is mechanically connected. The curved part 5, in a status in which driving force (ON driving electrostatic force and analog driving electrostatic force) is not being applied, curves so as to bend up from the substrate 2 side from the one end side toward the other end side as shown in FIG. 3 due to its own stress.

At the other end of the curved part 5, in a status in which driving force (ON driving electrostatic force and analog driving electrostatic force) is not being applied, one end of linear part 6, which has a flat plate shape due to its own stress, is mechanically connected.

At the other end of linear part 6, one end of the flat plate-shaped plate part 7 is mechanically connected. In the vicinity of the plate part 7, a standing part 7a, which constitutes a reinforcing level difference, is formed. Through this, the plate part 7 has rigidity and always maintains a flat plate shape.

At the other end of the plate part 7, in a status in which driving force (ON driving electrostatic force and analog driving electrostatic force) is not being applied, one end of linear part 8, which has a flat plate shape due to its own stress, is mechanically connected. The other end of linear part 8 is a free end. Support protrusions 16a and 16b are provided at linear part 6, and support protrusions 16c and 16d to be discussed below are provided at linear part 8. Support protrusions 16a and 16b, as shown in FIG. 1, are, at linear part 6, arranged at positions of distance L1 from standing part 7a of the plate part 7 of the right side of FIG. 1. Support protrusions 16c and 16d are, at linear part 8, arranged at positions of distance L1 from standing part 7a of the plate part 7 of the left side of FIG. 1. Support protrusions 16a~16d, when having come to the status shown in FIG. 5 and FIG. 6, come in contact with a fixed part (in the present embodiment, silicon oxide film 12 on the substrate 2) to support a portion in the vicinity of the plate part 7 (in the present embodiment, the plate part 7 as well as a portion 6a of length L1 of linear part 6 and a portion 8a of length L1 of linear part 8 of both sides thereof) in a double-supported status. At this time, portion 6a of length L1 of linear part 6 and portion 8a of length L1 of linear part 8 act as spring parts and support the plate part 7 so as to be able to interpose the gap with the substrate 2 while the plate part 7, which has rigidity, is parallel with the substrate 2.

As described above, by means of the respective parts 3~8 being sequentially mechanically connected in series, linear part 4, the curved part 5, linear part 6, the plate part 7 and linear part 8 as a whole comprise a movable part that has a cantilever beam structure having one end of linear part 4 as a fixed end. However, the movable part that can be employed in the present invention is not limited to such a cantilever beam structure.

The curved part 5 comprises three layers of thin film, wherein a lower side silicon nitride film 21, an intermediate aluminum alloy film 22, and an upper side silicon nitride film 23 have been laminated. The curved part 5, in a status in which it is not subject to a force, curves upward (toward the side opposite the substrate 2) as shown in FIG. 3 by means of the stress of films 21~23. Such a curved status can be achieved by appropriately setting the film formation conditions of films 21~23.

Linear part 4 comprises four layers of thin film, in which a lower side silicon nitride film 24, an intermediate lower side aluminum alloy film 25, an intermediate upper side aluminum alloy film 22 that extends continuously as-is from the curved part 5, and an upper side silicon nitride film 23 that extends continuously as-is from the curved part 5 have been laminated. Linear part 4, in a status in which it is not subject to a force, linearly extends as shown in FIG. 3 by means of the stress of films 22~25. Such a linear status can be realized by appropriately setting the film formation conditions of films 22~25.

The leg part 3 is comprised by silicon nitride films 23 and 24 and aluminum alloy films 22 and 25, which comprises linear part 4, respectively continuously extending as-is. Aluminum alloy film 25, at the leg part 3, is connected to wiring pattern 11 via an aperture formed in silicon nitride films 12 and 24.

Linear part 6, the plate part 7 and linear part 8 are comprised by a four-layer thin film resulting from stacking a lower side silicon nitride film 26, an intermediate lower side aluminum alloy film 27, an intermediate upper side aluminum alloy film 22 that continuously extends as-is from the curved part 5, and an upper side silicon nitride film 23 that extends as-is from the curved part 5. Whereas, support protrusions 16a~16d provided on linear parts 6 and 8 are comprised by aluminum alloy films 22 and 27. Linear parts 6 and 8, in a status in which they are not subject to force, linearly extend as shown in FIG. 3 by means of the stress of films 22, 23, 26 and 27. Such a linear status can be achieved by appropriately the setting the film formation conditions of films 22, 23, 26 and 27. In addition, the plate part 7 is always able to maintain a flat plate shape not only by setting of the film formation conditions of films 22, 23, 26 and 27 but also by being reinforced by the previously discussed standing part 7a.

As described above, in the present embodiment, a one-layer or two-layer conductive film (specifically, aluminum alloy films 22, 25 and 27) are formed so as to comprehensively conduct across the entire movable part (linear part 4, the curved part 5, linear part 6, the plate part 7 and linear part 8), and said conductive film is electrically connected to wiring pattern 11. In addition, in the present embodiment, said conductive film becomes an electrode to be discussed below or the wiring thereof depending on its location.

In the present embodiment, most of linear part 4 of the conductive film (aluminum alloy films 22, 25 and 27), the entire curved part 5, and a portion provided across a portion of linear part 6 are an ON driving movable electrode (fourth electrode part), and at locations that correspond to this ON driving movable electrode (the opposing locations in the respective statuses shown in FIG. 1, FIG. 2, FIG. 5 and FIG. 6), an ON driving fixed electrode (third electrode part) 13 comprising an aluminum alloy film is formed between silicon oxide films 10 and 12.

In the present embodiment, a portion of the plate part 7 of the conductive film (particularly, aluminum alloy films 22 and 27) is a capacity movable electrode (second electrode part). In the present embodiment, this capacity movable electrode also acts as an analog driving movable electrode. Wiring pattern 14, which comprises an aluminum alloy film that forms wiring with respect to the ON driving fixed electrode (third electrode part) 13, is formed between silicon oxide films 9 and 10. Though this is not shown in the drawing, wiring pattern 14 is electrically connected to the ON driving fixed electrode 13 via an opening formed in silicon oxide film 10. Wiring pattern 15, which comprises an aluminum oxide film, is formed between silicon oxide films 10 and 12. In the present embodiment, a portion of wiring pattern 15 that corresponds to the capacity movable electrode (a portion of wiring pattern 15 that opposes the plate part 7 in the respective statuses shown in FIG. 1, FIG. 2, FIG. 5 and FIG. 6) is the capacity fixed electrode (first electrode part). In the present embodiment, this capacity fixed electrode also acts as an analog driving fixed electrode.

The capacity of variable capacitor 1 according to the present embodiment is obtained as the capacity between the capacity movable electrode and the capacity fixed electrode and, therefore, the capacity between wiring patterns 11 and 15. Wiring pattern 15 can be used as, for example, a high frequency signal line, and wiring pattern 11 can be used as, for example, a ground line or a second high frequency signal line. Note that, in the present embodiment, wiring pattern 15 (and, therefore, the capacity fixed electrode) is electrically separated from the ON driving fixed electrode 13, but it is not necessarily limited to this.

Note that, regardless of the preceding description, in the present embodiment, the capacity movable electrode and the ON driving movable electrode are electrically connected, and both are connected to wiring pattern 11, but it is also possible to electrically separate the two electrodes.

In the present embodiment, by appropriately setting the degree of the curve of the curved part 5 in the status shown in FIG. 3 and the length of the curved part 5, in the status shown in FIG. 3, the capacity movable electrode (a portion of the plate part 7 of aluminum alloy films 22 and 27) is set so as to essentially not oppose wiring pattern 15, which is the capacity fixed electrode. In the present embodiment, in this way, not only does the capacity movable electrode essentially not oppose the capacity fixed electrode but, by appropriately setting the length of the curved part 5, the distance between the capacity movable electrode (a portion of the plate part 7 of aluminum alloy films 22 and 27) and wiring pattern 15, which is the capacity fixed electrode, in the status shown in FIG. 3 is set to be adequately long, and, through this, in the status shown in FIG. 3, the capacity between the capacity movable electrode and the capacity fixed electrode becomes nearly 0. For example, the capacity between the capacity movable electrode and the capacity fixed electrode in the status shown in FIG. 3 may also be set to $1/10$ or less, $1/100$ or less or $1/1000$ or less the capacity between the capacity movable electrode and the capacity fixed electrode in the status shown in FIG. 5. In the present embodiment, in a plan view as seen from the direction of the normal line of the principal surface of the substrate 2, the direction from the fixed end (one end of linear part 4 connected to the leg part 3) side to the free end (the front end of linear part 8) side is orthogonal to the direction in which wiring pattern 15 extends. Therefore, compared to the case in which that direction forms a diagonal, in the status shown in FIG. 3, in the case in which the capacity between the capacity movable electrode and the capacity fixed electrode tends to become closer to 0, and variable capacitor 1 is plurally arrayed as in the case of the second embodiment to be discussed below, it is possible to increase the wiring density. Note that, depending on the application, in the status shown in FIG. 3, there are also cases in which it is preferable that the capacity between the capacity movable electrode and the capacity fixed electrode be closer to 0 without limit (for example, in the case of the second embodiment to be discussed below), and there are also cases in which a certain capacity is desirable (for example, in the case in which said variable capacitor 1 is used alone).

In addition, in the present embodiment, by appropriately setting the length of the curved part 5 and the positional relationship of the wiring pattern 15, in the respective statuses shown in FIG. 5 and FIG. 6, the variable movable electrode (a portion of the plate part 7 of aluminum alloy films 22 and 27) is set so as to oppose a part of wiring pattern 15, which is the capacity fixed electrode. In the present embodiment, as discussed previously, in the respective statuses shown in FIG. 5 and FIG. 6, support protrusions 16a~16d come into contact with silicon oxide film 12 on the substrate 2.

Note that, in variable capacitor 1 according to the present embodiment, a microactuator that drives the objects to be driven (linear parts 6 and 8 and the plate part 7) is comprised by elements other than linear parts 6 and 8, the plate part 7 and wiring pattern 15.

Next, an example of the method of manufacturing variable capacitor 1 according to the present embodiment will be described while referring to FIG. 7a~FIG. 9b. FIG. 7a~FIG. 9b are schematic cross-sectional views that show the respective manufacturing processes and correspond to FIG. 2.

Figure 7A:
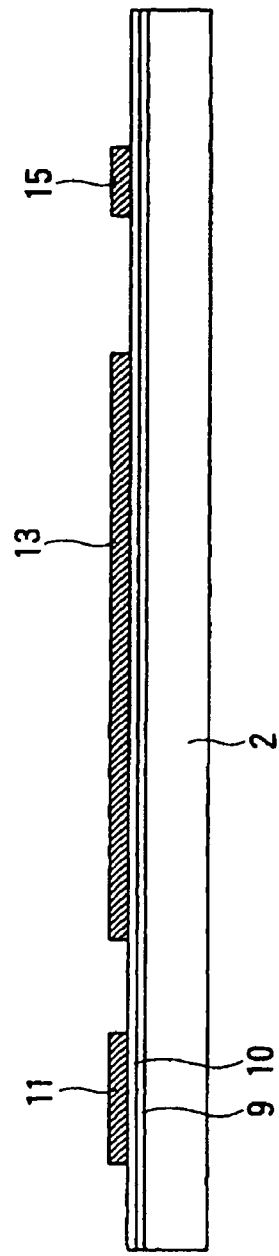
FIGS. 7a and 7b are process drawings that show the manufacturing method of a variable capacitor according to the first embodiment of the present invention.

First, silicon oxide film 9 is formed on the silicon substrate 2 over the entire surface. Next, an aluminum alloy film is formed on silicon oxide film 9, and that aluminum alloy film is patterned to the shape of wiring pattern 14 (not shown in FIG. 7a~FIG. 9b; see FIG. 1) by a photolithoetching method. After that, silicon oxide film 10 is deposited, and then an opening that becomes the contact part with wiring pattern 14 is formed on that silicon oxide film 10 by a photolithoetching method. Then, an aluminum alloy film is deposited, and that the aluminum alloy film is patterned to the shapes of wiring patterns 11 and 15 and the ON driving fixed electrode 13 by a photolithoetching method. FIG. 7a shows this status. Note that, aluminum, copper, gold, etc. may also be used as the material of wiring patterns 11 and 15 and the ON driving fixed electrode 13. In addition, in the case in which a variable capacitor 1 according to the present embodiment is used as the high frequency circuit, it is also possible for the film thickness of wiring patterns 11 and 15 and the ON driving fixed electrode 13 to be, for example, 1 μm or more or 2 μm or more.

Figure 7B:
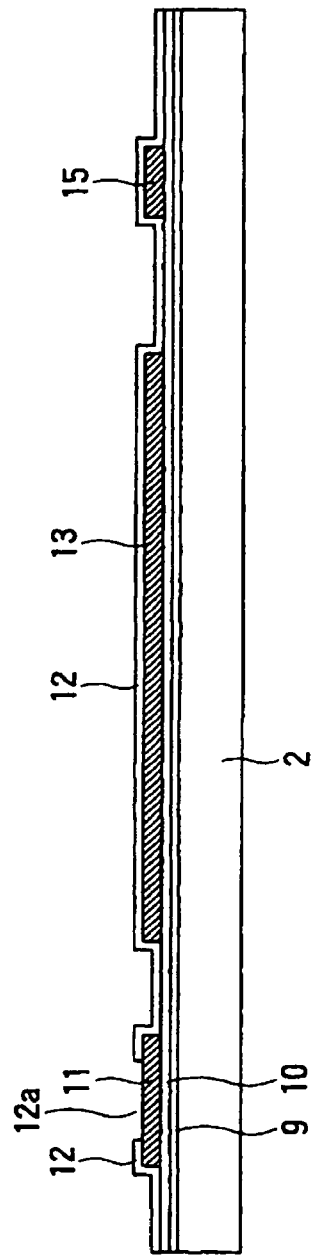

Next, after silicon oxide film 12 has been deposited to the entire surface, an opening 12a that becomes the contact part with wiring pattern 11 of the leg part 3 is formed on that silicon oxide film 12 by a photolithoetching method. FIG. 7b shows this status.

Figure 8A:
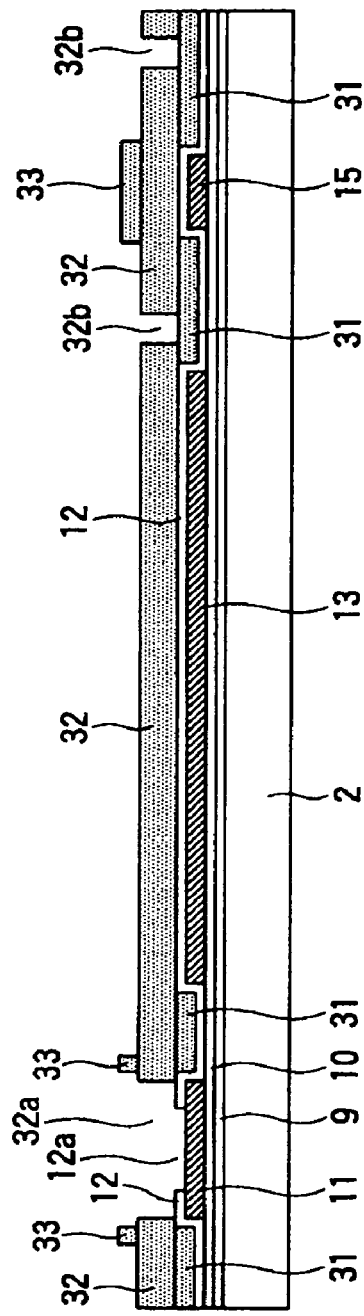
FIGS. 8a and 8b are process drawings that show the process following FIGS. 7a and 7b.

Next, a sacrificial layer 31, such as a resist, is embedded into a recess on the substrate (however, locations corresponding to the leg part 3 are excepted) in the status shown in FIG. 7b. Then, a sacrificial layer 32, such as a resist, is coated, and, at that sacrificial layer 32, by means of photolithography, an opening 32a is formed at the position at which the leg part 3 is to be formed, and an opening 32b is formed at positions at which support protrusions 16a-16d are to be formed. In addition, a sacrificial layer 33, such as a resist, is coated, and that sacrificial layer 33 is patterned to the shapes of the standing part 3a of the upper part of the leg part 3 and the standing part 7a of the plate part 7 by means of photolithography. FIG. 8a shows this status.

Figure 8B:
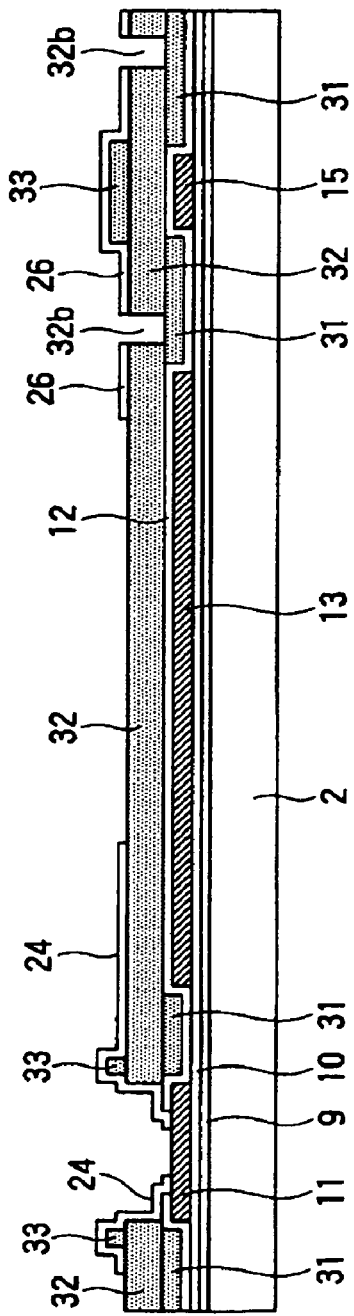

After that, a silicon nitride film is deposited onto the entire surface, and then that silicon nitride film is patterned to the shape of silicon nitride film 24 of the leg part 3 and linear part 4 and the shapes of silicon nitride film 26 of linear parts 6 and 8 and the plate part 7 by a photolithoetching method. FIG. 8b shows this status.

Figure 9A:
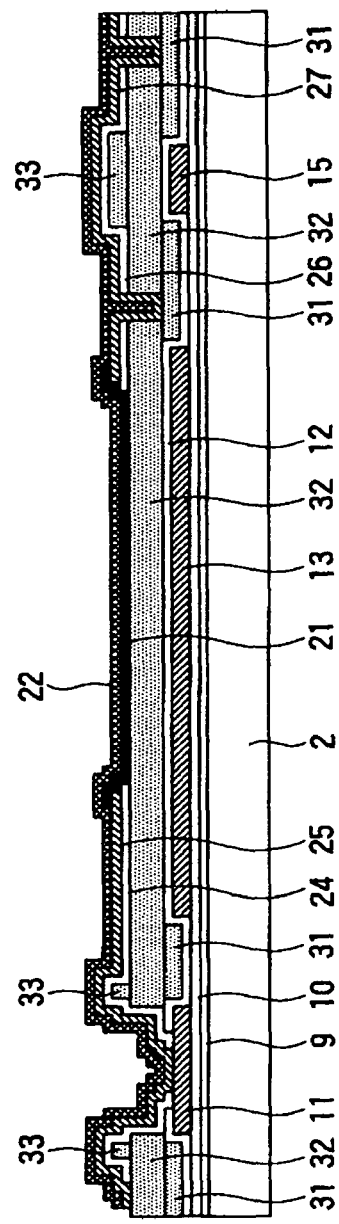
FIGS. 9a and 9b are process drawings that show the process following FIGS. 8a and 8b.

Next, an aluminum alloy film is deposited, and that aluminum alloy film is patterned to the shapes of aluminum alloy film 25 of the leg part 3 and linear part 4 and the shapes of the aluminum alloy film 27 of linear parts 6 and 8 and the plate part 7 by a photolithoetching method. Next, silicon nitride film 21 is deposited, and that silicon nitride film 21 is patterned to match the shape of the curved part 5 by a photolithoetching method. Then, aluminum alloy film 22 is deposited, and that aluminum alloy film 22 is patterned to match the shapes of the leg part 3, linear part 4, the curved part 5, linear part 6, the plate part 7 and linear part 8 by a photolithoetching method. FIG. 9a shows this status.

Figure 9B:
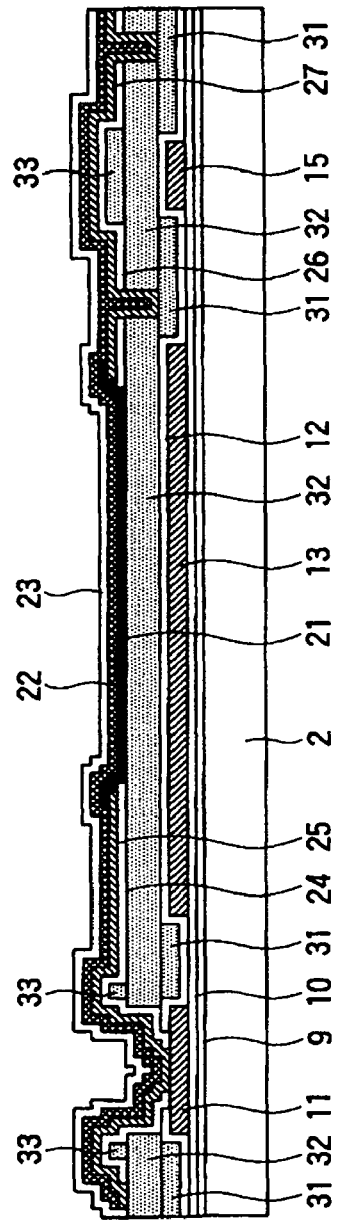

Next, a silicon nitride film 23 is deposited, and silicon nitride film 23 is patterned to match the shapes of the leg part 3, linear part 4, the curved part 5, linear part 6, the plate part 7 and linear part 8 by a photolithoetching method. FIG. 9b shows this status.

After that, a sacrificial layer (not shown) such as a resist is coated to the entire surface, and then dividing for each chip is performed using a dicing saw, etc. Lastly, sacrificial layers 31~33 and the other sacrificial layers are removed. Through this, the curved part 5 is curved upward as shown in FIG. 3, and a variable capacitor 1 according to the present embodiment is completed.

Note that formation of silicon nitride films 21, 23, 24 and 26 and aluminum alloy films 22, 25 and 27, which comprise the movable parts, is performed after the sacrificial layers have been removed under conditions such that a shape such as that shown in FIG. 3 results due to the stress at the time of film formation.

Next, the operation of variable capacitor 1 according to the present embodiment will be described while referring to FIG. 3~FIG. 6.

If the electric potential is made the same between wiring pattern 11 and the ON driving fixed electrode 13, and a direct current bias voltage is applied between wiring pattern 11 and wiring pattern 15, an electrostatic force (ON driving electrostatic force) is not applied between the ON driving movable electrode (a portion extending across most of linear part 4 as well as the entirety of the curved part 5 and a portion of linear part 6 of aluminum alloy films 22, 25 and 27) and the ON driving fixed electrode 13, and an electrostatic force (analog driving electrostatic force) is not applied between the capacity movable electrode (a portion of the plate part 7 of aluminum alloy films 22 and 27) and the capacity fixed electrode (a part of wiring pattern 15). Therefore, the status shown in FIG. 3 results. In the status shown in FIG. 3, linear part 4, due to its own stress, extends approximately parallel with the principal plane of the substrate 2 in a status in which a gap has been opened from the substrate 2 side (fixed part). In addition, in the status shown in FIG. 3, the curved part 5, due to its own stress, curves so as to bend up from the substrate 2 side. Linear parts 6 and 8 have a flat plate shape due to their own stresses. As a result, in the present embodiment, in the status shown in FIG. 3, the capacity movable electrode (a portion of the plate part 7 of aluminum alloy films 22 and 27) goes into a non-opposing status in which it essentially does not oppose the capacity fixed electrode (a part of wiring pattern 15), and the capacity C between these two electrodes becomes nearly 0. The capacity C between the two electrodes is nearly 0, so the status is essentially identical to the status in which capacity formation between the two electrodes has been turned off. Therefore, there are cases in which the status shown in FIG. 3 is called the non-opposing status or the OFF status.

In a conventional MEMS variable capacitor, with a parallel flat plate as the basic principle, the capacity movable electrode and the capacity fixed electrode that are to form the variable capacity are always used in an opposing status, and it is said that it is necessary to vary the capacity by varying the gap between the two electrodes, but this is conventional technical wisdom. With variable capacitor 1, according to the present embodiment, in contrast with such conventional technical wisdom, it is possible to achieve the non-opposing status shown in FIG. 3.

Next, in the status shown in FIG. 3, the status transition in the case in which a voltage (first drive signal) larger than a prescribed magnitude is applied between wiring pattern 11 and the ON driving fixed electrode 13 will be described. This voltage may be direct current or alternating current. In this case, an ON driving electrostatic force is applied between the ON driving movable electrode (a portion extending across the greater portion of linear part 4 as well as the entirety of the curved part 5 and a portion of linear part 6 of aluminum alloy films 22, 25 and 27) and the ON driving fixed electrode 13. In the initial status shown in FIG. 3, the gap between the linear part 4 portion of the ON driving movable electrode and the ON driving fixed electrode 13 is small compared to the gap between the curved part 5 portion of the ON driving movable electrode and the ON driving fixed electrode 13, so a large electrostatic force is applied between the linear part 4 portion of the ON driving movable electrode and the ON driving fixed electrode 13, and not as much electrostatic force is applied between the curved part 5 portion of the ON driving movable electrode and the ON driving fixed electrode 13. As a result, first, as shown in FIG. 4, only linear part 4 is pulled in to the ON driving fixed electrode 13 side. When the status shown in FIG. 4 results, the curved part 5 portion of the ON driving movable electrode is such that the gap with respect to the ON driving fixed electrode 13 in the vicinity of the fixed end side thereof markedly narrows, and large electrostatic force is received from the ON driving fixed electrode 13. As a result, the curved part 5 is sequentially pulled in to the ON driving fixed electrode 13 side from the fixed end side portion to the front end side, and, ultimately, as shown in FIG. 5, pulling in of the curved part 5 to the ON driving fixed electrode 13 side is completed.

Figure 10:
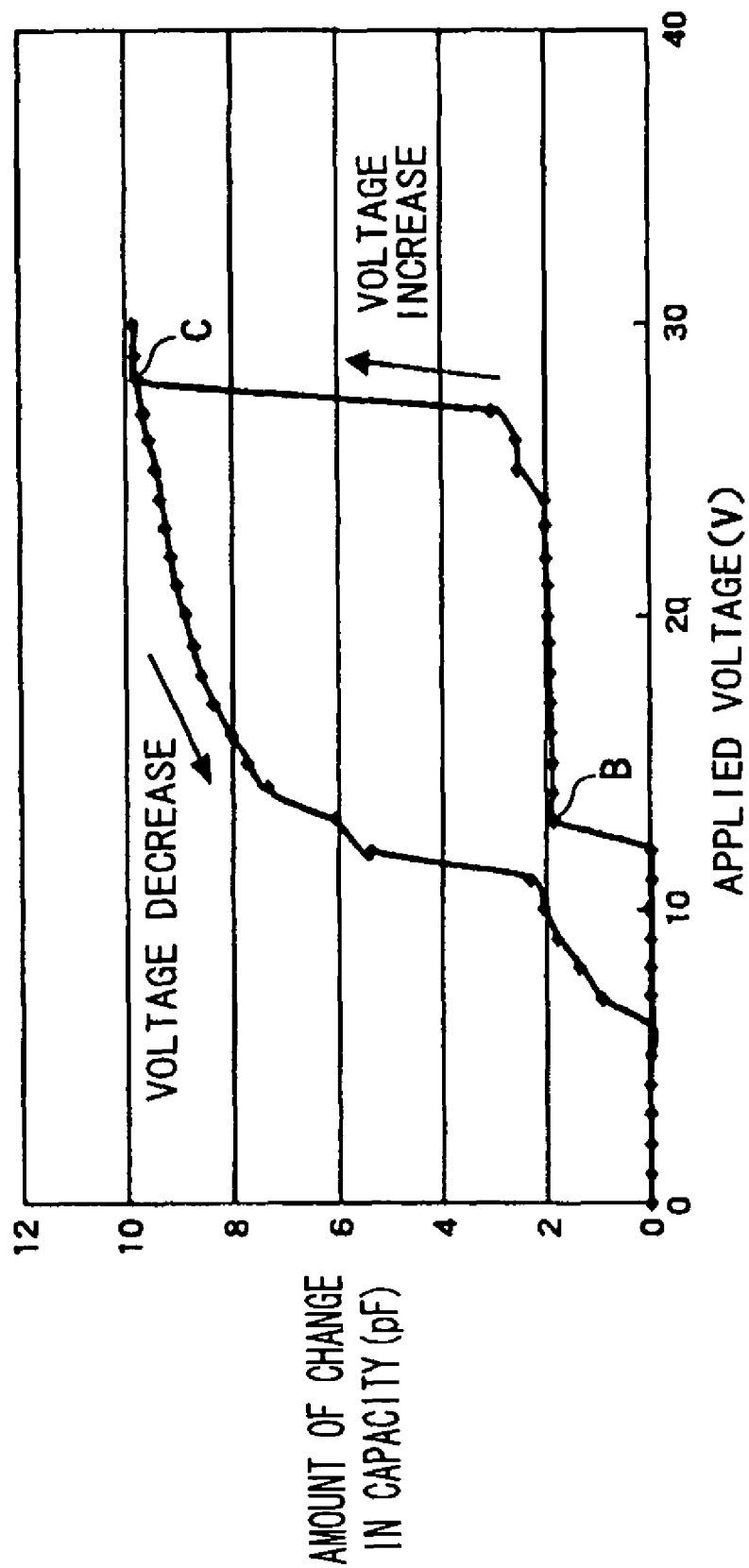
FIG. 10 is a drawing that shows the measurement results relating to a variable capacitor according to the first embodiment of the present invention.

The present inventors have demonstrated the operation of such a variable capacitor 1 (particularly, the operation of a microactuator) in the following way. Specifically, the present inventors have made a prototype of the variable capacitor similar to variable capacitor 1 according to the present embodiment. In this prototype variable capacitor, the direct current applied voltage applied between wiring pattern 11 and the ON driving fixed electrode 13 was gradually increased from 0 V and then gradually decreased again to 0 V. Then, the capacity values between wiring pattern 11 and the ON driving fixed electrode 13 were respectively measured as index values, such as those previously discussed, that show the respective operating statuses (displacement statuses) of variable capacitor 1 when the respective applied voltages were being applied. In this variable capacitor, the fact that linear part 4 and the curved part 5 move farther from the ON driving fixed electrode 13 the smaller the measured capacity value is shown, and the fact that linear part 4 and the curved part 5 approach the ON driving fixed electrode 13 the larger the measured capacity value is shown. That measurement status is shown in FIG. 10. The horizontal axis of FIG. 10 shows the direct current applied voltage between wiring pattern 11 and the ON driving fixed electrode 13. The vertical axis of FIG. 10 shows, with the capacity value measured when the applied voltage was 0 V as a reference, the amount of change (difference) of the measured capacity value with respect to this reference capacity value. In FIG. 10, point B, at which the measured capacity value has increased in a step form in the vicinity of an applied voltage of 13 V, corresponds to a status in which only linear part 4 has initially been pulled in to the fixed electrode 13 side as shown in FIG. 4. Point C, at which the measured capacity value has greatly rapidly increased in the vicinity of an applied voltage of 28 V, corresponds to a status in which both linear part 4 and the curved part 5 have initially been pulled in to the ON driving electrode 13 side as shown in FIG. 5. Based on FIG. 10, it is understood that the operation discussed above of variable capacitor 1 according to the present embodiment (particularly, the operation of a microactuator) has been demonstrated.

In the present embodiment, variable capacitor 1 (particularly, that microactuator) performs the operation previously discussed, so, compared to a case such as that in which a configuration in which linear part 4 is removed, and one end of the curved part 5 (the left end in FIG. 1 and FIG. 2) has been directly fixed to the leg part 3 is employed, it is possible to set a status in which the curved part 5 has been pulled in to the fixed electrode 13 side at a lower drive voltage. Furthermore, in the present invention, it is also possible to employ a configuration in which linear part 4 is removed, and one end of the curved part 5 (the left end in FIG. 1 and FIG. 2) is directly fixed to the leg part 3.

In the present embodiment, in the status shown in FIG. 5, support protrusions 16a~16d come into contact with silicon oxide film 12 on the substrate 2. In addition, by means of support protrusions and 16a~16d, a portion in the vicinity of the plate part 7 (in the present embodiment, a portion 6a of length L1 of linear part 6 and a portion 8a of length L1 of linear part 8 of both sides thereof) is supported in a double-supported status. In the status shown in FIG. 5, the capacity movable electrode (a portion of the plate part 7 of aluminum alloy films 22 and 27) goes into an opposing status in which it opposes the capacity fixed electrode (a part of wiring pattern 15), and the capacity C between these two electrodes becomes not nearly 0 but a prescribed value that is substantially larger that has been set in advance. Therefore, the status shown in FIG. 5 is a status that is essentially identical to the status in which capacity formation between these two electrodes has been turned on (specifically, as in the status in which the capacity formed when the two electrodes are in an opposing status has been effectively connected by turning on with a switch between wiring patterns 11 and 15). Therefore, there are cases in which the status shown in FIG. 5 is called an opposing status or an ON status. With regard to this point, the status shown in FIG. 6 is similar to the status shown in FIG. 5, so there are cases in which the status shown in FIG. 6 is called an opposing status or an ON status.

In the status shown in FIG. 5, a status is shown in which a direct current bias voltage is not being applied between wiring pattern 11 and wiring pattern 15, and an electrostatic force (an analog driving electrostatic force) is not being applied between the capacity movable electrode (a portion of the plate part 7 of aluminum alloy films 22 and 27) and the capacity fixed electrode (a part of wiring pattern 15). In the status shown in FIG. 5, an analog driving electrostatic force is not being applied, so portion 6a of length L1 of linear part 6 and portion 8a of length L1 of linear part 8 come to have a flat plate shaped due to their own stresses.

In the status shown in FIG. 5, the capacity movable electrode (a portion of the plate part 7 of aluminum alloy films 22 and 27) and the capacity fixed electrode (a portion of the plate part 7 of aluminum alloy films 22 and 27) form a parallel flat plate, and the gap g between the two electrodes becomes an initial gap d0. This initial gap d0 can be appropriately set, for example, according to the respective thicknesses of sacrificial layers 32 and 33 in FIG. 9(b). In addition, in the status shown in FIG. 5, the capacity C between the capacity movable electrode and the capacity fixed electrode depends not only on the gap g but the opposition area S of the two electrodes.

Figure 11:
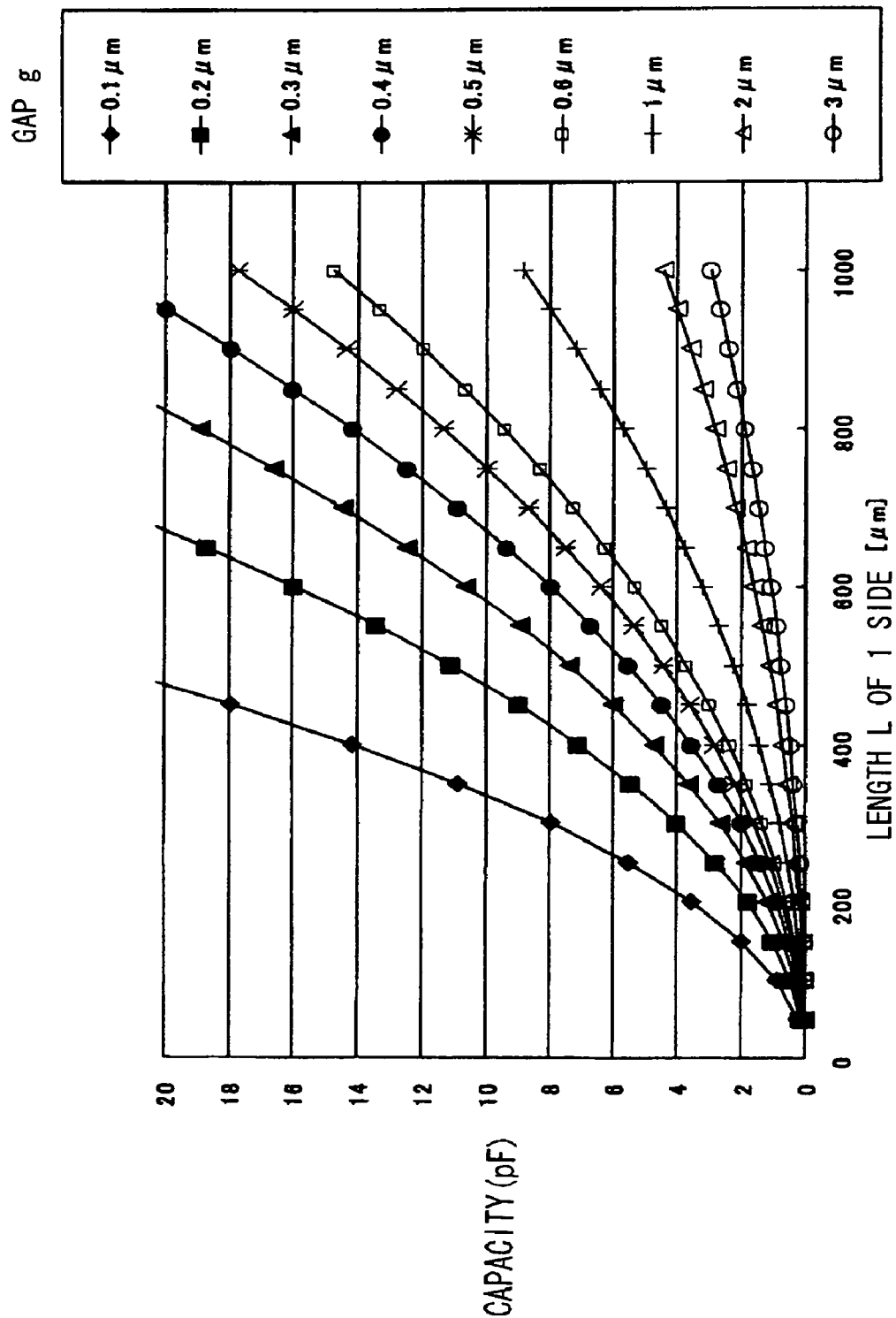
FIG. 11 is a drawing that shows the relationship between the area between parallel flat plates and the capacity.

FIG. 11, a realistic example of the scope of the dimensions that can be adopted by variable capacitor 1 according to the present embodiment, is a drawing that shows the relationship between the opposition area S and the capacity for each of the respective gaps g in the case in which the two electrodes are parallel flat plates. The horizontal axis of FIG. 11 is shown by length L of one side of a square that has said opposition area S as an index value of the opposition area S for obtaining an image of the dimensions. For example, the 600 µm of the horizontal axis of FIG. 11 indicates the fact that the opposition area S is 600 µm×600 µm. When a variable capacitor 1 according to the present embodiment is designed, it is possible to use FIG. 11 to set the initial gap d0 of the gap g and the opposition area S (specifically, the area of the plate part 7 and the width of wiring pattern 15).

FIG. 6 is such that, in addition to being the same ON status as FIG. 5 (a status in which a voltage (first drive signal) that is greater than a prescribed magnitude is applied between wiring pattern 11 and ON driving fixed electrode 13, and both linear part 4 and curved part 5 are pulled in to the ON driving fixed electrode 13 side, and support protrusions 16a-16d come in contact with silicon oxide film 12 on the substrate 2), it differs from the case of FIG. 5 and shows a status in which a direct current bias voltage (second drive signal) of a prescribed magnitude is applied between wiring pattern 11 and wiring pattern 15, and an electrostatic force (an analog driving electrostatic force) of a prescribed strength is applied between the capacity movable electrode (a portion of the plate part 7 of aluminum alloy films 22 and 27) and the capacity fixed electrode (a part of wiring pattern 15), and the respective portions 6a, 8a of linear parts 6 and 8 bend downward, and the gap g between the two electrodes has narrowed to d1 (d1<d0). In the present embodiment, similarly to a conventional variable capacitor, by varying in an analog manner the direct current bias voltage applied between wiring pattern 11 and wiring pattern 15, it is possible to vary the gap g between the two electrodes from the initial gap d0 to d0/3 at which pull-in occurs, so it is possible to vary the capacity between the two electrodes in an analog manner up to 1.5×C0, which is a capacity value 1.5 times the capacity value C0 at the time of the initial gap d0.

Note that the stiffness of the spring characteristics of the respective portions 6a, 8a of linear parts 6 and 8 varies according to the length L1 of these portions 6a, 8a. Therefore, by varying this length L1, specifically, the positions of support protrusions 16a~16d, it is possible to vary the sensitivity of the direct current bias voltage (second drive signal) applied between wiring pattern 11 and wiring pattern 15 with respect to changes in the gap g between the two electrodes, and, in turn, it is possible to vary the sensitivity of the direct current bias voltage with respect to changes in the capacity obtained between the two electrodes in an ON status.

Note that, in the status shown in FIG. 5, although support protrusions 16a and 16b of the curved part 5 side reliably come into contact with silicon oxide film 12 on the substrate 2, there is a possibility that support protrusions 16c and 16d of the front end side will float somewhat from silicon oxide film 12. In such a case, it is possible, as necessary, to also reliably bring the front end side support protrusions 16c and 16d into contact with silicon oxide film 12 by applying a small direct current bias voltage (bias voltage that hardly changes at all from capacity value C0) between wiring pattern 11 and wiring pattern 15, and it is possible to obtain a stable capacity value C0.

In the ON status (opposing status) shown in FIG. 5 and FIG. 6, when the electric potential is made the same between wiring pattern 11 and the ON driving fixed electrode 13, and the direct current bias voltage applied between wiring pattern 11 and wiring pattern 15 is made 0, there is a return to the OFF status (non-opposing status) shown in FIG. 3.

As is understood from the above description, variable capacitor 1 according to the present embodiment has a function that is essentially equivalent to that of a conventional series circuit of a variable capacitor and a switch. Specifically, in the OFF status (non-opposing status) shown in FIG. 3 of variable capacitor 1 according to the present embodiment, the capacity C between the capacity fixed electrode and the capacity movable electrode is nearly 0, so the status shown in FIG. 3 is essentially equivalent to a status in which the switch is turned off in said series circuit. In addition, the ON status (opposition status) shown in FIG. 5 and FIG. 6 of variable capacitor 1 according to the present embodiment is essentially equivalent to the status in which the switch has been turned on in said series circuit. Moreover, in the movable capacitor 1 according to the present embodiment, this does not actually mean that it has a switch, so a special which becomes unnecessary, and, through this, it is possible to reduce the occupied area, and it is possible to prevent a reduction in the Q value. In addition, it is also possible to reduce reflection loss of the RF signal due to wiring, the inductance component and the parasitic capacity.

Therefore, in obtaining the desired capacity variation range by combining a plurality of capacitors, if variable capacitor 1 according to the present embodiment is used as at least one of said plurality of capacitors, it is possible to reduce the number of special switches commensurately with the use of variable capacitor 1 according to the present embodiment, and it is possible to commensurately reduce the occupied area and to prevent a reduction in the Q value. One example of this will be described as the second embodiment to be discussed below. However, in the present invention, a capacitor apparatus in which a plurality of capacitors are combined is such that, for example, if at least one of the plurality of capacitors is, for example, a variable capacitor 1 according to the present embodiment, the other capacitors may be variable capacitors disclosed in, for example, Non-patent Document 1 or fixed capacitors disclosed in Patent Document 1, it may also include a MEMS switch, etc. that also acts as said fixed capacitor, etc., the connection relationship of the respective capacitors may be not only parallel connections but series connections as well, and a connection relationship in which series and parallel are appropriately combined, such as a series-parallel connection, may also be employed.

In addition, in variable capacitor 1 according to the present embodiment, the capacity C obtained in the OFF status (non-opposing status) shown in FIG. 3 is nearly 0, but it is not 0 but a sufficiently small value compared to the capacity C0. Therefore, according to variable capacitor 1 according to the present embodiment, without specially requiring other capacitors and switches, it is possible to obtain a sufficiently small capacity value obtained in the OFF status shown in FIG. 3, and a capacity value from C0 obtained in the ON status (opposition status) up to 1.5×C0 can be obtained, and it is possible to obtain a capacity value that includes a two-value capacity in which the mutual ratio is large. Therefore, variable capacitor 1 according to present embodiment is effective even if used alone without combining with other capacitors.

In the present invention, variable capacitor 1 according to the present embodiment may be modified, for example, as described below.

In the present embodiment, support protrusions 16a~16d are provided at movable side linear parts 6 and 8, but it is also possible to instead provide support protrusions 16a~16d at the fixed part side (the substrate 2 side).

In the present embodiment, the plate part 7 also has rigidity by means of the standing part 7a in the vicinity thereof, but, without forming standing part 7a, the plate part 7 may also be a leaf spring shape similar to portions 6a and 8a of the two sides. In this case, in the ON status, the plate part 7 and portions 6a and 8a of the two sides thereof are a double-supported beam that can be bent overall, and an analog operation that varies gap d in the ON status is possible.

In the present embodiment, in the ON status shown in FIG. 5 and FIG. 6, the plate part 7 and portions 6a and 8a of the two sides thereof are supported in a double-supported status by means of support protrusions 16a~16d, but, for example, the front end side support protrusions 16c, 16d may also be removed, and, in the ON status, the plate part 7 and portions 6a and 8a of the two sides thereof may be supported in a cantilever status by support protrusions 16a and 16b. In this case as well, an analog operation that varies gap d in the ON status is possible. Note that in the case in which such a cantilever status is employed, linear part 8 is not necessary. In addition, in a case in which such a cantilever status is employed, the plate part 7 may be made bendable without forming the standing part 7a in the vicinity of the plate part 7.

In the present embodiment, as previously discussed, an analog operation that varies the gap d in the ON status is possible, but the configuration may also be such that an analog operation is not possible without varying gap d in the ON status being possible. Specifically, for example, support protrusions 16a~16d may be arranged directly below the standing part 7a, or support protrusions 16a~16d may be removed.

In the present embodiment, as previously discussed, the variable movable electrode (a portion of the plate part 7 of aluminum alloy films 22 and 27) also acts as an electrode (analog driving movable electrode) for varying gap d in the ON status, and the capacity fixed electrode (a portion of wiring pattern 15 that the capacity movable electrode opposes in the ON status) also acts as an electrode (analog driving fixed electrode) for varying gap d in the ON status. However, a capacity movable electrode and an analog operation movable electrode may also be separately provided, and a capacity fixed electrode and an analog operation fixed electrode may also be separately provided.

Figure 12:
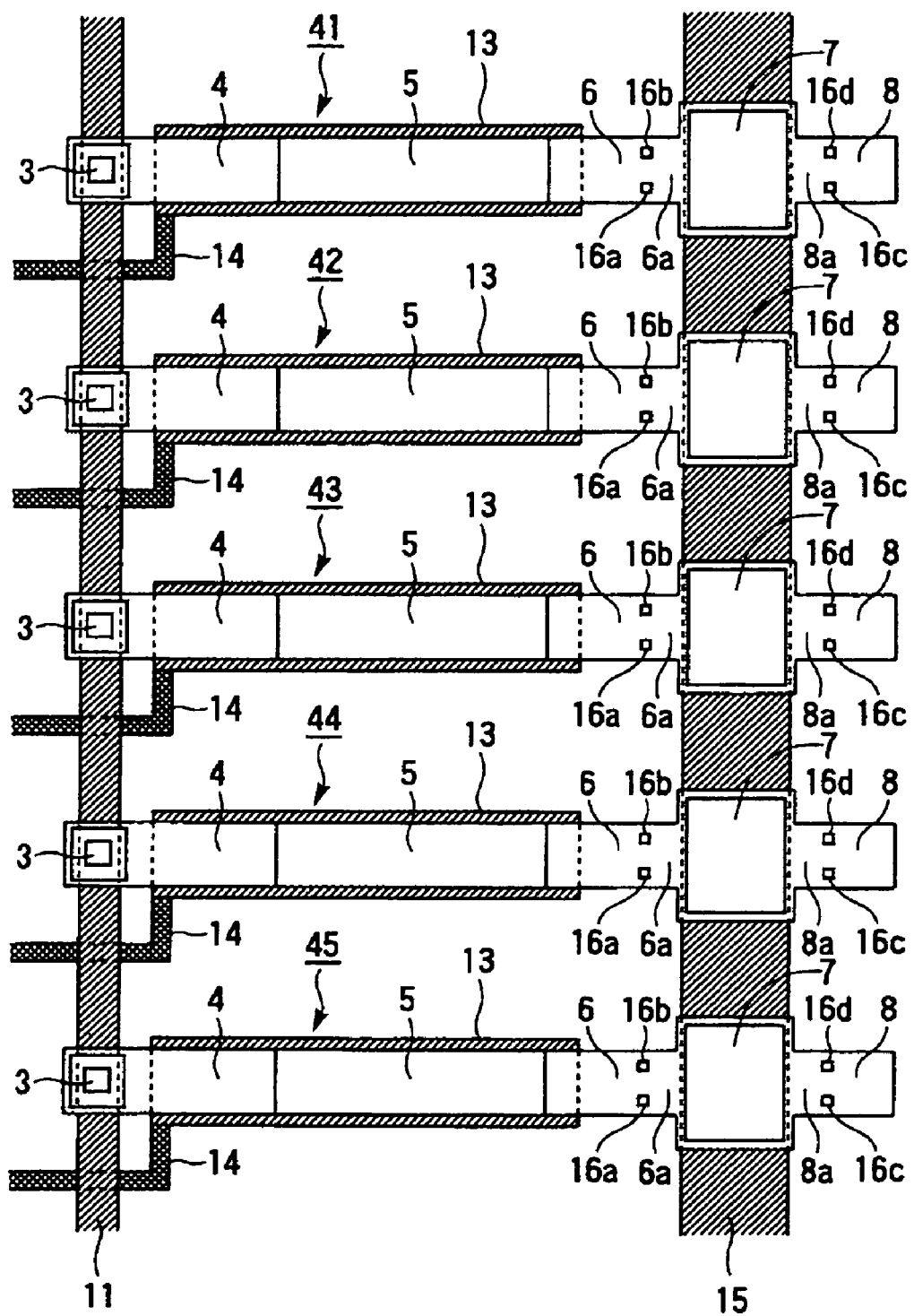
FIG. 12 is a schematic plan view that schematically shows the principal parts of a variable capacitor apparatus according to the second embodiment of the present invention.
Figure 13:
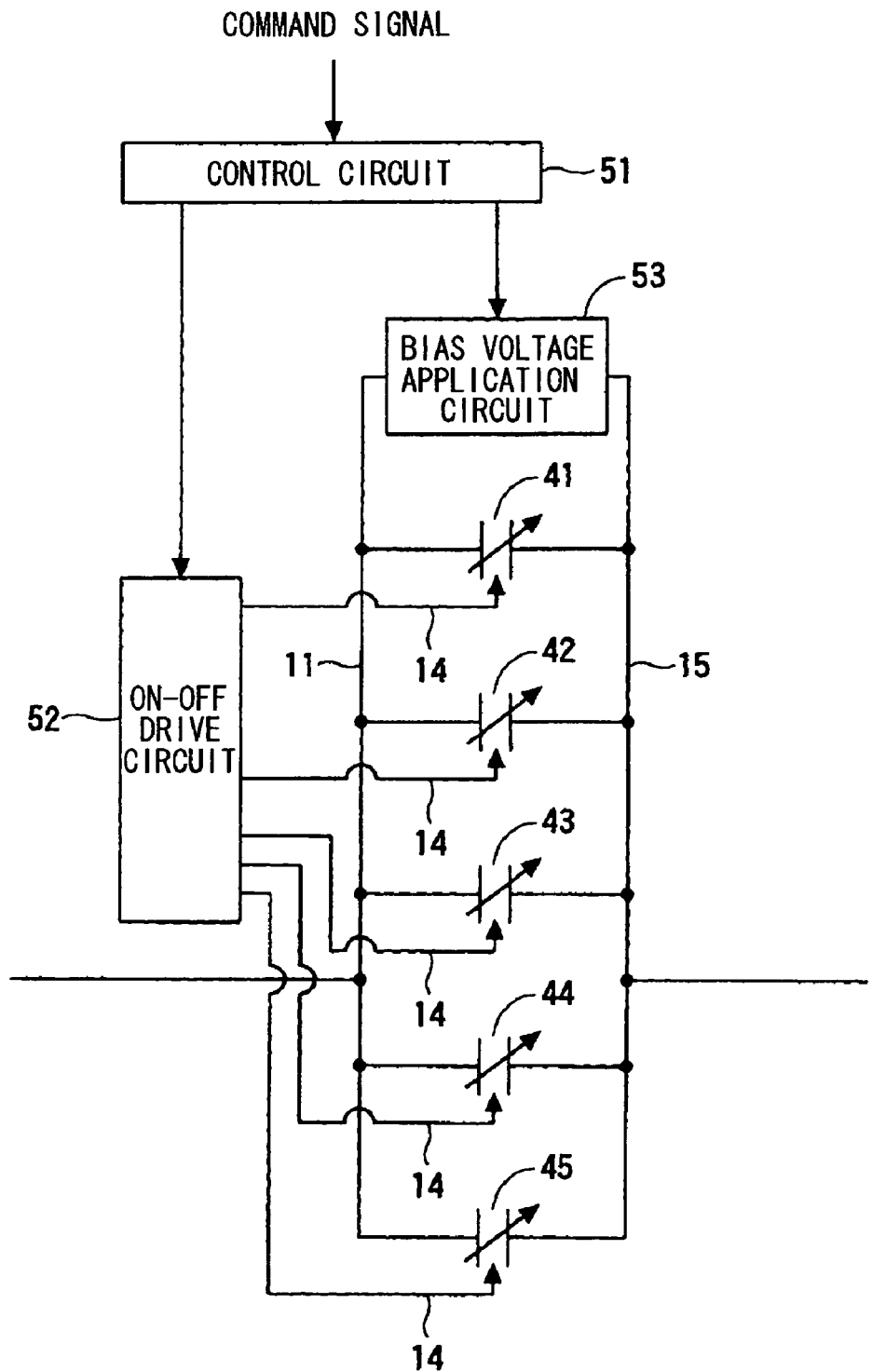
FIG. 13 is a circuit diagram that shows a variable capacitor apparatus according to the second embodiment of the present invention.

FIG. 12 is a schematic plan view that schematically shows the principal parts of a variable capacitor apparatus according to the second embodiment of the present invention, and it corresponds to FIG. 1. FIG. 12, similarly to FIG. 1, also shows a status prior to removal of the sacrificial layers in the course of manufacturing. In FIG. 12, elements that are identical to or that correspond to the elements in FIG. 1 are assigned identical symbols, and duplicate descriptions thereof will be omitted. FIG. 13 is a circuit diagram that shows a variable capacitor apparatus according to the present embodiment.

The variable capacitor apparatus according to the present embodiment comprises five variable capacitors 41~45 respectively having identical configurations and dimensions of the respective parts as variable capacitor 1 according to the first embodiment, a control circuit 51, an ON-OFF drive circuit 52 and a bias voltage application circuit 53.

Variable capacitors 41~45 are allocated on identical silicon substrates 2 (not shown in FIG. 12 and FIG. 13). With regard to variable capacitors 41~45, the previously discussed wiring patterns 11 and 15 are respectively connected in common, and, as shown in FIG. 13, variable capacitors 41~45 are connected in parallel.

In the present embodiment, the ON-OFF drive circuit 52, in response to an ON-OFF control signal (a control signal that shows the ON-OFF statuses of the respective variable capacitors 41~45) from the control circuit 51, supplies a first drive signal to the respective variable capacitors 41~45 (specifically, applies an ON driving voltage (the drive voltage required to put said variable capacitor into an ON status) between corresponding wiring pattern 14 and wiring pattern 11 or makes wiring pattern 14 the same electric potential as wiring pattern 11) so as to obtain the ON-OFF status said ON-OFF control signal indicates. Note that, in the present embodiment, the respective wiring patterns 14 are respectively electrically separated and are such that the respective variable capacitors 41~45 can be respectively independently set by means of the ON-OFF drive circuit 52.

The bias voltage application circuit 53, in response to a bias voltage control signal (a signal that indicates the direct current bias voltage to be applied between wiring patterns 11 and 15) from the control circuit 51, supplies a direct current bias voltage indicated by said bias voltage control signal between wiring patterns 11 and 15.

The control circuit 51, in response to command signals (signals that show the command values of the capacities to be obtained by wiring patterns 11 and 15) from the respective parts, respectively supplies the ON-OFF control signal and bias voltage control signal required for the capacity value that said command signal indicates to be obtained to the ON-OFF drive circuit 52 and the bias voltage application circuit 53. Due to influences such as manufacturing error, even if a direct current bias voltage of the same magnitude is applied between wiring patterns 11 and 15 in the same ON-OFF status of variable capacitors 41~45, the capacity values obtained between wiring patterns 11 and 15 become dispersed. In the present embodiment, utilizing the fact that the respective variable capacitors 41~45 are capable of analog operations such as those discussed previously, the control circuit 51 is comprised so as to calibrate and output a bias voltage control signal so that the capacity command value indicated by the command signal can be accurately obtained between wiring patterns 11 and 15 according to the relationship obtained based on actually measured data (the relationship between the ON-OFF status of the respective variable capacitors 41~45, the direct current bias voltage, and the capacity value obtained between wiring patterns 11 and 15).

Note that, depending on the application, the control circuit 51 may also be configured so that the previously discussed analog operations are used only for the purpose of calibration, and discrete capacity values are obtained, and it may also be configured so that the previously discussed analog operations are used and continuous capacity values are obtained within a certain range.

The control circuit 51, the ON-OFF drive circuit 52 and the bias voltage application circuit 53 may also be equipped on the silicon substrate 2 and may also be arranged at the exterior. Portions of the variable capacitors 41~45 can be manufactured according to the manufacturing method described while referring to FIG. 7~FIG. 9, and the manufacturing method thereof is compatible with a CMOS process, so in the case in which the control circuit 51, the ON-OFF drive circuit 52 and the bias voltage application circuit 53 are equipped on the silicon substrate 2, stacking the CMOS parts of these circuits under portions of variable capacitors 41~45 and arranging them in a region that differs from that of variable capacitors 41~45 in the surface direction of the substrate 2 can be easily performed. In addition, an example of circuit that is equipped onto the substrate 2 is a high frequency circuit filter, which includes a capacitor apparatus according to the present embodiment, or other high frequency circuits, etc. In addition, in the present invention, even in the case in which a single variable capacitor 1 according to the first embodiment is used, it is possible to load a high frequency circuit filter, which includes said variable capacitor 1, or another high frequency circuit, etc. onto the substrate 2. In this case as well, stacking the CMOS parts of these circuits under a portion of variable capacitor 1 and arranging them in a region that differs from that of variable capacitor 1 in the surface direction of the substrate 2 can be easily performed.

Figure 14:
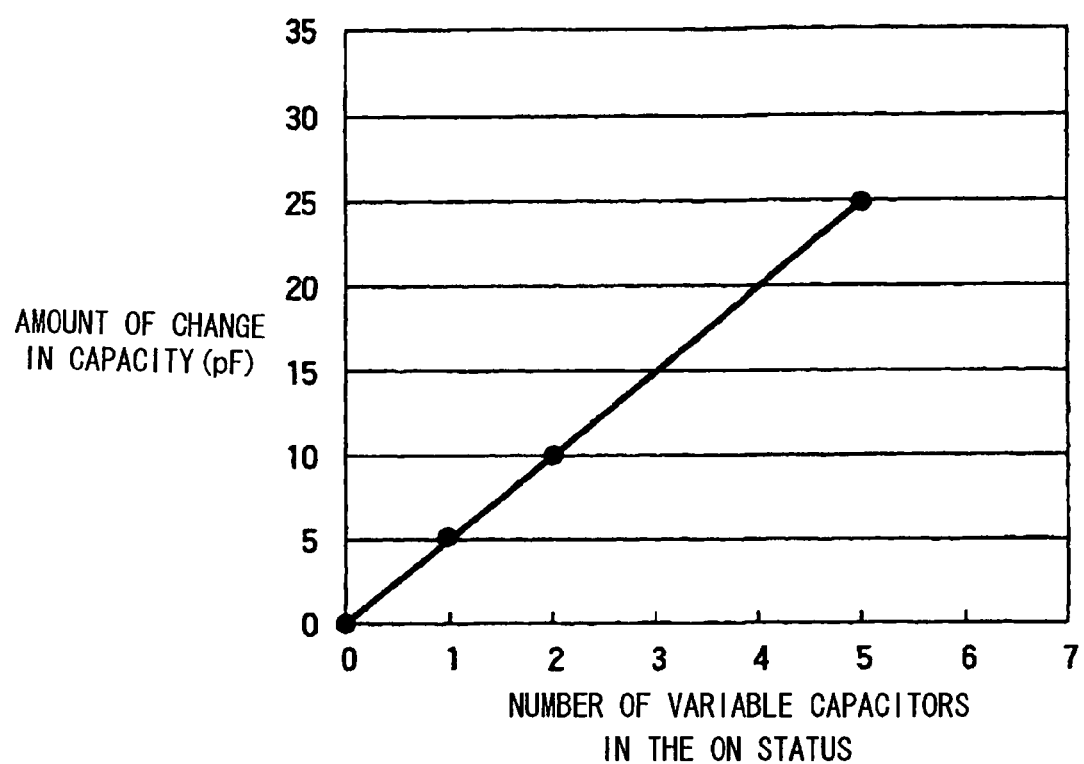
FIG. 14 is a drawing that shows measurement results relating to a variable capacitor apparatus according to the second embodiment of the present invention.

The present inventors have made a prototype of a capacitor apparatus similar to the capacitor apparatus of the present embodiment. In this prototype variable capacitor apparatus, the number of variable capacitors put into an ON status from among variable capacitors 41~45 was varied, and the capacity between wiring patterns 11 and 15 was measured in those respective cases. However, a direct current bias voltage was not applied between wiring patterns 11 and 15. FIG. 14 shows the measurement results thereof. The horizontal axis of FIG. 14 shows the number of variable capacitors in an ON status from among variable capacitors 41~45. For example, 0 on the horizontal axis of FIG. 14 means that all of variable capacitors 41~45 have been put into an OFF status, and 2 on the horizontal axis of FIG. 14 means that two of variable capacitors 41~45 have been put into an ON status and the other three have been put into an OFF status. The vertical axis of FIG. 14 indicates the amount of change of the capacity between wiring patterns 11 and 15. Here, in the case in which all of variable capacitors 41~45 have been put into an OFF status, the capacity between wiring patterns 11 and 15 is 0 pf.

In the present embodiment, the respective variable capacitors 41~45 are identical as far as the dimensions of the respective parts, so if a direct current bias voltage is not applied, it would appear that the capacity between wiring patterns 11 and 15 would change in proportion with the number of respective variable capacitors 41~45. FIG. 14 demonstrates that fact.

According to the present embodiment, previously discussed variable capacitors 41~45 that have a configuration that is identical to that of previously discussed variable capacitor 1 are used, so in contrast with a conventional capacitor apparatus in which a plurality of capacitors were combined, special switches are not required, and only one wiring will suffice. Therefore, according to the present embodiment, it is possible to reduce the occupied area, and it is possible to prevent a decrease in the Q value.

Note that a variable capacitor in which variable capacitor 1 has been modified so that analog operation is not possible as previously discussed may also be used as the respective variable capacitors 41~45. In this case, the bias voltage application circuit 53 is removed.

Figure 15:
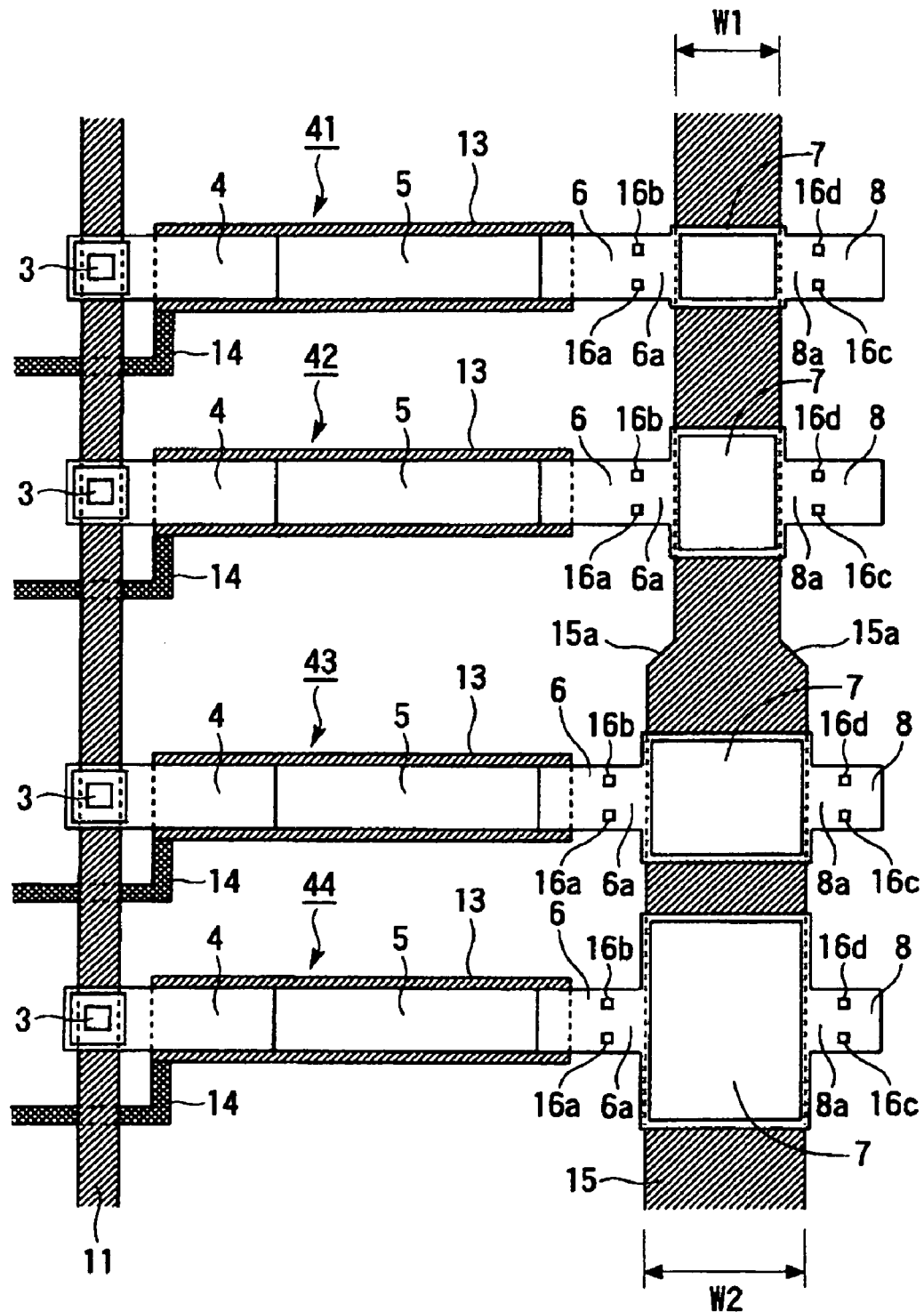
FIG. 15 is a schematic plan view that schematically shows the principal parts of a variable capacitor apparatus according to the third embodiment of the present invention.

FIG. 15 is a schematic plan view that schematically shows the principal parts of a variable capacitor apparatus according to a third embodiment of the present invention and corresponds to FIG. 12. FIG. 15 also shows, similarly to FIG. 12, a status prior to removal of the sacrificial layers in the course of manufacturing. In FIG. 15, elements that are identical to or that correspond to the elements in FIG. 12 are assigned identical symbols, and duplicate descriptions thereof will be omitted.

The variable capacitor apparatus according to the present embodiment differs from the variable capacitor apparatus according to the second embodiment only on the points to be described below. In the present embodiment, variable capacitor 45 is eliminated. Whereas, in the second embodiment, all of variable capacitors 41~45 have an identical opposition area between the capacity fixed electrode and capacity movable electrode in the ON status, in the present embodiment, as shown in FIG. 15, in variable capacitors 41~44, the opposition area between the capacity fixed electrode and the capacity movable electrode in the ON status sequentially becomes larger. In conjunction with this, in the present embodiment, the width W2 of the portion that corresponds to variable capacitors 43 and 44 of wiring patterns 11 becomes wide in comparison to the width W1 of the portion that corresponds to variable capacitors 41 and 42 of wiring pattern 11. In the present embodiment, wiring pattern 11 is used as the high frequency signal line, so a 45° taper part 15a is formed at the seams thereof of wiring pattern 11 so that reflection of a high frequency signal becomes unlikely to occur at the seams between width W1 and width W2.

According to the present embodiment, in addition to it being possible to achieve benefits similar to those of the second embodiment, due to the fact that the capacities of the respective capacitors 41~44 in the ON status respectively differ, it is also possible to achieve a benefit in that it is possible to vary the capacity between wiring patterns 11 and 15 in a wider range compared to the first embodiment.

Figure 16:
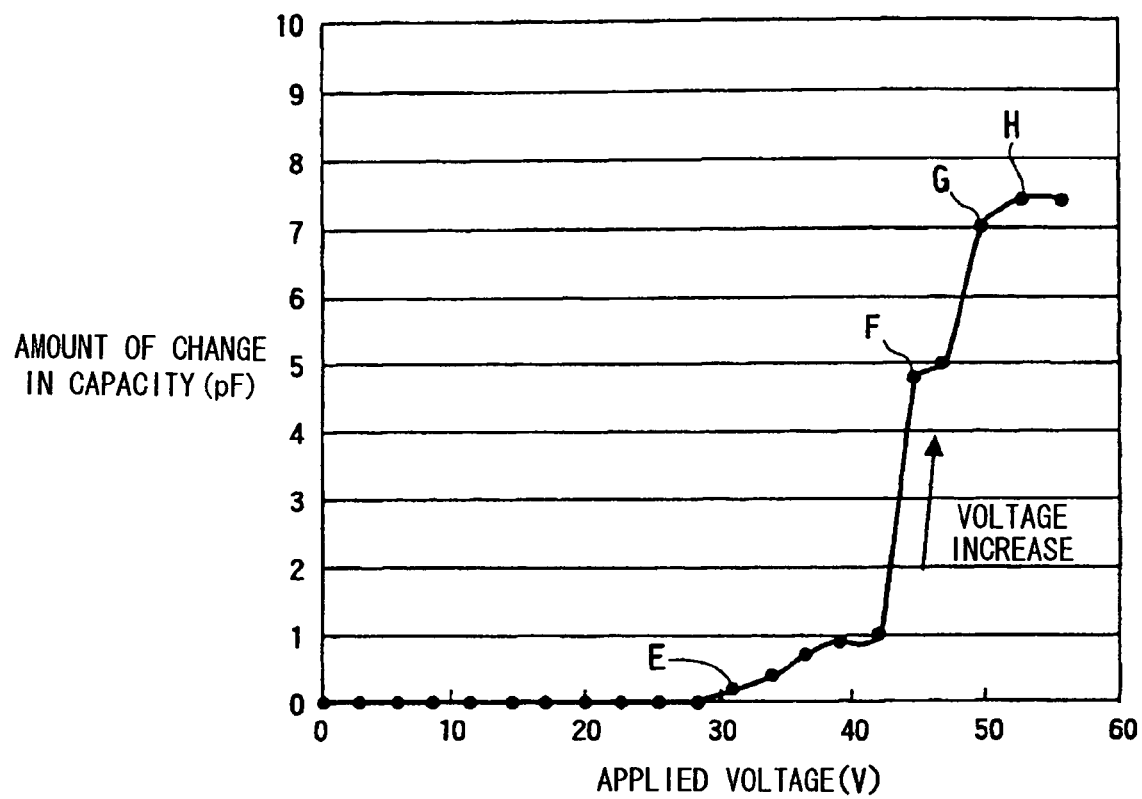
FIG. 16 is a drawing that shows measurement results relating to a variable capacitor apparatus according to the third embodiment of the present invention.

The present inventors have created a prototype of a capacitor apparatus similar to the capacitor apparatus of the present embodiment. In this prototype variable capacitor apparatus, for experimentation, wiring pattern 15 and all of wiring pattern 14 were short-circuited, a direct current voltage was applied between these and wiring pattern 11, that applied voltage was gradually increased, and when the respective applied voltages were being applied, the capacity between wiring patterns 11 and 15 was measured. The results thereof are shown in FIG. 16. The horizontal axis of FIG. 16 shows the applied voltage, and the vertical axis of FIG. 16 shows the amount of change of the capacity between wiring patterns 11 and 15. Here, in the case in which all of variable capacitors 41~45 are in an OFF status, the capacity between wiring patterns 11 and 15 was an extremely small capacity value of approximately 0 pF.

In FIG. 16, at point E, variable capacitor 41 was in an ON status, variable capacitors 42 and 43 were in an OFF status, and the capacity of wiring patterns 11 and 15 was 0.2 pF. At point F, variable capacitors 41, 42 and 44 were in an ON status, variable capacitor 43 was in an OFF status, and the capacity of wiring patterns 11 and 15 was 4.8 pF, which was 24 times the 0.2 pF capacity of point E. At point G, all of variable capacitors 41~44 were in an ON status, and the capacity of wiring patterns 11 and 15 was 7 pF, which was 35 times the 0.2 pF capacity of point E. At point H, all of variable capacitors 41~44 were in an ON status, but the analog operation is considered to have advanced (the gap between electrodes narrowed) compared to the case of point G, and the capacity of wiring patterns 11 and 15 was 7.4 pF, which was 37 times the 0.2 pF capacity of point E.

According to FIG. 16, the fact that it is possible to vary the capacity between wiring patterns 11 and 15 in the extremely wide range from 0 pF to 7.4 pF (the rate of change of the capacity in the case in which point E was used as a reference was 7.4/0.2=37) was demonstrated.

Note that, normally, in the case in which the drive voltage has been increased as shown in FIG. 16, it would not appear that variable capacitors 41~44 turn on in the sequence discussed above if based on the desired plan outlook, but it is thought that they turned on in such a sequence due to the effects of a manufacturing error, etc. For the experimental results here, the relationship between the ON-OFF status of variable capacitors 41~44 and the obtained capacity is important, and the sequence of turning on is not particularly a problem.

In any case, in the present embodiment, for example, capacity values C41~C44 of the ON status (here, considered to be during the initial gap of d0, but, for example, it may also be a status calibrated according to the analog operations previously discussed) of the four variable capacitors 41~44 may be respectively set, for example, to 1×ΔC, 2×ΔC, 4×ΔC and 8×ΔC with ΔC being any capacity value. This setting can be performed, for example, by setting the opposition area between the capacity fixed electrode and the capacity movable electrode in the ON status of variable capacitors 41~44 to one time, two times, three times and four times respectively. When the capacity values of the ON status of variable capacitors 41~44 are set in the manner previously discussed, by independently controlling the ON-OFF of the respective variable capacitors 41~44, it is possible to digitally obtain capacity values from 1×ΔC to 15×ΔC in ΔC increments. Of course, if the four variable capacitors 41~44 are put into the OFF status, the obtained capacity values can also be essentially set to 0.

Similarly, in the present embodiment, for example, capacity values C41~C44 of the ON status (here, considered to be during the initial gap of d0, but, for example, it may also be a status calibrated according to the analog operations previously discussed) of the four variable capacitors 41~44 may be respectively set, for example, to 10×ΔC, 20×ΔC, 40×ΔC and 80×ΔC with ΔC being any capacity value. In this case, by independently controlling the ON-OFF of the respective variable capacitors 41~44, it is possible to digitally obtain capacity values from 10×ΔC to 150×ΔC in 10×ΔC increments. Of course, if the four variable capacitors 41~44 are put into the OFF status, the obtained capacity values can also be essentially set to 0.

In the present embodiment, the four variable capacitors 41~44 are connected in parallel, but, for example, the number of units may be set to 8 units, and the capacity values of the ON status (here, considered to be during the initial gap of d0, but, for example, it may also be a status calibrated according to the analog operations previously discussed) of the eight variable capacitors may be respectively set, for example, to 1×ΔC, 2×ΔC, 4×ΔC and 8×ΔC, 10×ΔC, 20×ΔC, 40×ΔC and 80×ΔC. In this case, by independently controlling the ON-OFF of these eight variable capacitors, it is possible to digitally obtain capacity values from 1×ΔC to 165×ΔC in ΔC increments. Of course, if the eight variable capacitors are put into the OFF status, the obtained capacity values can also be essentially set to 0. The present inventors have actually created a prototype of such a digital variable capacitor apparatus and have confirmed that it is possible to digitally obtain capacity values from 1×ΔC to 165×ΔC in AC increments. For example, if one in which ΔC=0.01 pF were created, it would be possible to digitally obtain capacity values from 0.01 pF to 1.65 pF in 0.01 pF increments. In addition, if one in which ΔC=0.1 pF were created, it would be possible to digitally obtain capacity values from 0.1 pF to 16.5 pF in 0.1 pF increments. Moreover, if one in which ΔC=0.2 pF were created, it would be possible to digitally obtain capacity values from 0.2 pF to 33 pF in 0.2 pF increments.

Figure 17:
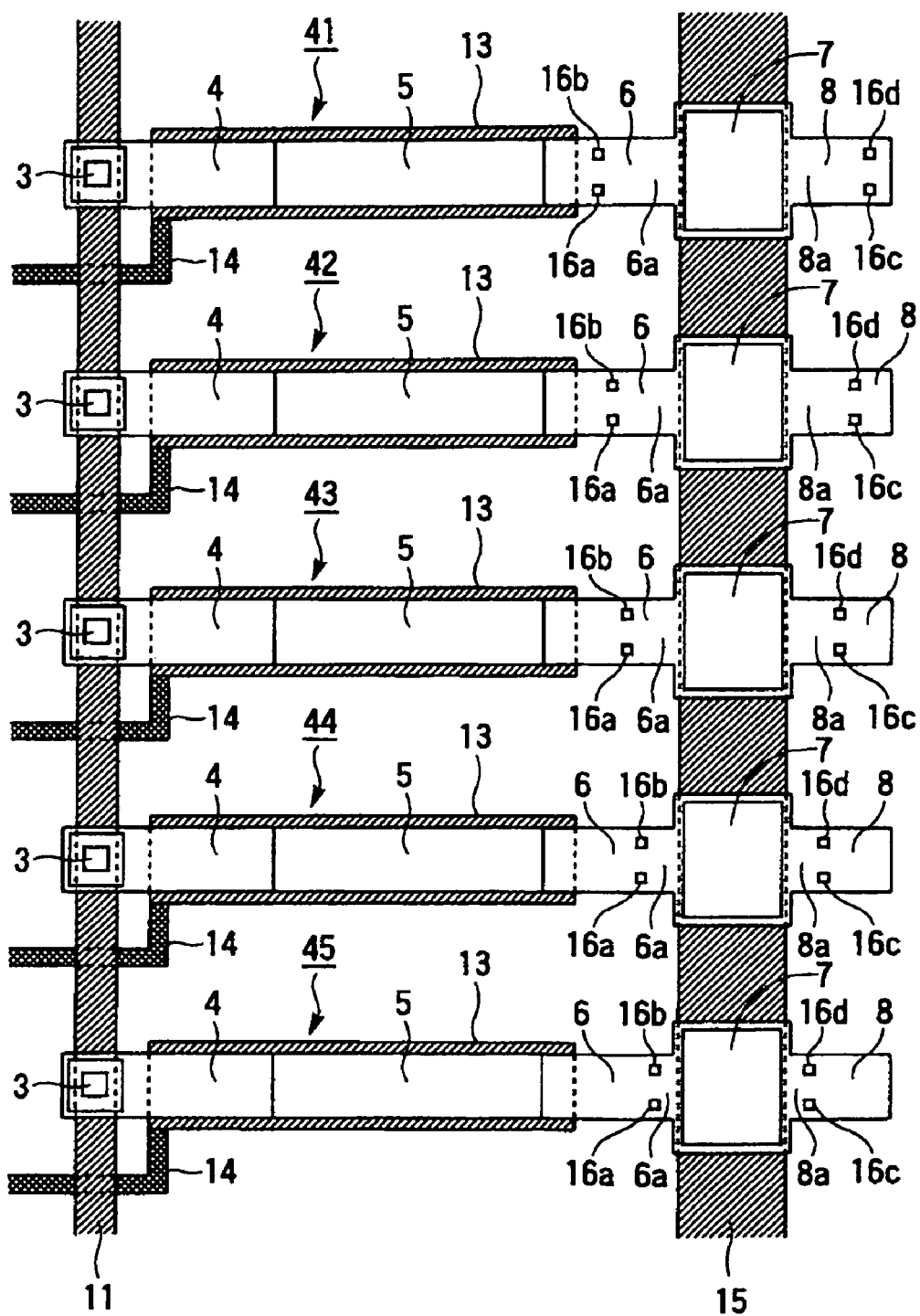
FIG. 17 is a schematic plan view that schematically shows the principal parts of a variable capacitor apparatus according to the fourth embodiment of the present invention.

FIG. 17 is a schematic plan view that schematically shows the principal parts of a variable capacitor apparatus according to the fourth embodiment of the present invention and corresponds to FIG. 12. FIG. 17 also shows, similarly to FIG. 12, a status prior to removal of the sacrificial layers in the course of manufacturing. In FIG. 17, elements that are identical to or that correspond to the elements in FIG. 12 are assigned identical symbols, and duplicate descriptions thereof will be omitted.

The variable capacitor apparatus according to the present embodiment differs from the variable capacitor apparatus according to the second embodiment only on the point that, in the respective variable capacitors 41~45, the length of portion 6a of linear part 6 and the length of portion 8a of linear part 8 (corresponding to L1 in FIG. 1) mutually differ. Therefore, at the respective variable capacitors 41~45, the stiffness of the spring effects of the respective portions 6a, 8a of linear parts 6 and 8 mutually differs and, in turn, the sensitivities of the direct current bias voltage (second drive signal) applied between wiring patterns 11 and 15 with respect to the respectively obtained capacities mutually differ.

Therefore, according to the present embodiment, the following benefits can also be obtained in addition to realizing benefits similar to those of the second embodiment. Specifically, according to the present embodiment, for example, in the case in which all of the variable capacitors 41~45 are in an ON status, and the direct current bias voltage applied between wiring patterns 11 and 15 is gradually varied, the capacity between wiring patterns 11 and 15 greatly changes compared to the first embodiment. Therefore, according to the present embodiment, it is possible to obtain a benefit in that the capacity between wiring patterns 11 and 15 can be varied in a wider region than in the first embodiment.

Figure 18A:
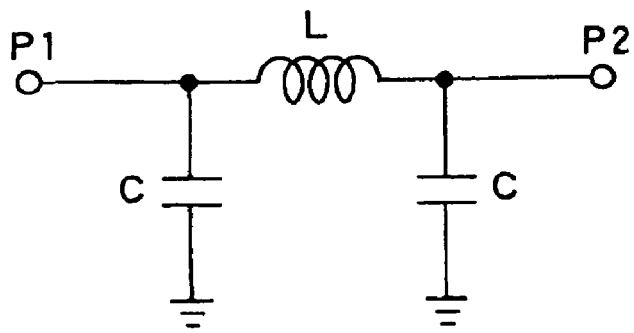
FIGS. 18a-18d are drawings showing various examples of high frequency circuit filters according to the present invention.
Figure 18B:
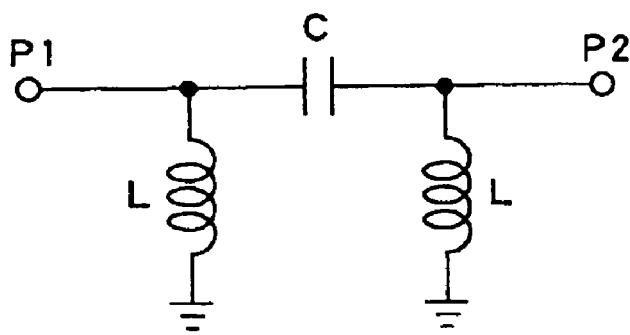
Figure 18C:
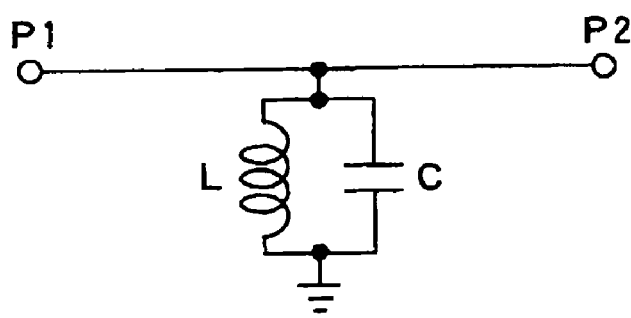
Figure 18D:
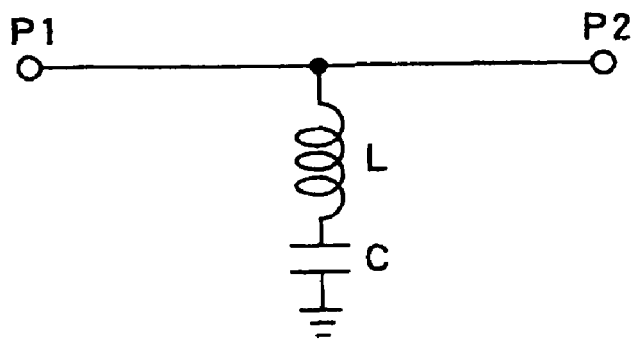

Here, as examples of a higher frequency circuit, the respective examples of a high frequency circuit filter are shown in FIGS. 18a-18d. FIG. 18a shows a low pass filter, FIG. 18b shows a high pass filter, FIG. 18c shows a band pass filter, and FIG. 18d shows a band elimination filter. In these drawings, C indicates a capacitor, L indicates the inductance, and P1 and P2 indicate ports.

For the high frequency circuit filters according to the respective embodiments of the present invention, in the filters respectively shown in FIGS. 18a-18d, instead of capacitor C, it is possible to present as an example a filter that uses variable capacitor 1 according to the first embodiment or a modification example thereof or a variable capacitor apparatus according to any of the second through fourth embodiments. Of course, the variable capacitor and variable capacitor apparatus according to the present invention may also be used in various high frequency circuits other than filters (for example, variable frequency oscillators (VFO), tuned amplifiers, phase shifters, impedance matching circuits, etc.).

Although few embodiments of the present invention have been shown and described, it would be appreciated by those skilled in the art that changes may be made in these embodiments without departing from the principles and sprit of the invention, the scope of which is defined in the claims and their equivalents.

For example, in the embodiments discussed above, the actuator for switching between the opposing status and the non-opposing status employed in the respective variable capacitors was an electrostatic type in which an electrostatic force was used as the driving force, but it is also possible to employ various microactuators such as so-called heat types, electromagnetic types or piezoelectric drive types.

What is claimed is:

1. A variable capacitor comprising:
   a fixed part including a substrate;
   a first electrode part provided on the fixed part; and
   a movable part having a second electrode part which forms the capacity of the variable capacitor between itself and the first electrode part,
   wherein the movable part is displaced in response to a first drive signal to selectively go into an opposing status, in which the second electrode part opposes the first electrode part, and a non-opposing status, in which the second electrode part substantially does not oppose the first electrode part.

2. The variable capacitor according to claim 1, wherein the movable part comprises a thin film.

3. The variable capacitor according to claim 1, wherein the capacity in the non-opposing status is nearly 0.

4. The variable capacitor according to claim 1, wherein the capacity in the opposing status is 10 times or more the capacity in the non-opposing status.

5. The variable capacitor according to claim 1, wherein:
   the movable part has a cantilever beam structure, which has a fixed end fixed to the fixed part; and
   the second electrode part is arranged at a front end side of the movable part.

6. The variable capacitor according to claim 5, wherein the first electrode part forms a part of a high frequency signal line, and, in a plan view as seen from a normal line direction of a principal surface of the substrate, the direction from the fixed end side toward the front end side is approximately orthogonal to the direction in which the high frequency signal line extends.

7. The variable capacitor according to claim 5, wherein the movable part has a curved part, which is arranged between the second electrode part and the fixed end, and a linear part, which is arranged between the curved part and the fixed end,
   the curved part, in a status in which driving force is not being applied to the movable part, curves so as to bend up from the fixed part side from the fixed end side toward the front end side due to its own stress, and
   the linear part, in a status in which driving force is not being applied to the movable part, extends in a direction approximately parallel to the principal plane of the substrate from the fixed end side toward the front end side in a status in which a gap has been opened up from the fixed part due to its own stress, and, in a status in which driving force is not being applied to the movable part, goes into a non-opposing status.

8. The variable capacitor according to claim 7, wherein the fixed part has a third electrode part at a location that corresponds to at least a part of the linear part and at least a part of the curved part,
   the movable part has a fourth electrode part at the linear part and the curved part, and
   an electrostatic force, which acts between the third and fourth electrode parts by way of a drive voltage being applied between the third and fourth electrode parts as the first drive signal, is applied to the movable part as the driving force according to the first drive signal, when a driving force of a prescribed strength or more according to the first drive signal is applied to the movable part, by way of said driving force, at least a part of the linear part and at least a part of the curved part are pulled into the fixed part side and go into the opposing status.

9. The variable capacitor according to claim 8, wherein the second electrode part and the fourth electrode part are electrically connected.

10. The variable capacitor according to claim 8, wherein the first electrode part and the third electrode part are electrically separated.

11. The variable capacitor according to claim 1, wherein the substrate is a circuit substrate on which a complementary metal-oxide-semiconductor (CMOS) part has been equipped.

12. The variable capacitor according to claim 1, wherein the movable part, in the opposing status, is partially displaced in response to a second drive signal so that the gap between at least a part of the first electrode part and the second electrode part changes.

13. The variable capacitor according to claim 12, further comprising a support protrusion that comes into contact with the fixed part or the movable part in the opposing status at a location in the vicinity of the second electrode of the movable part or at a location of the fixed part corresponding to that location so that a portion of the vicinity of the second electrode of the movable part is supported by of the fixed part in the opposing status.

14. The variable capacitor according to claim 13, wherein a portion in the vicinity of the second electrode of the movable part is supported in a double-supported status via the support protrusion by a fixed part in the opposing status.

15. The variable capacitor according to claim 12, wherein an electrostatic force, which acts between the first and second electrode parts by way of a direct current bias voltage being applied between the first and second electrode parts as the second drive signal, is applied to the movable part as the driving force according to the second drive signal.

16. A variable capacitor apparatus comprising:
   a plurality of capacitors electrically connected so that a compound capacity resulting from the capacities of said plurality of capacitors being combined is obtained,
   wherein at least one of the capacitors of the plurality of capacitors is a variable capacitor according to claim 1.

17. The variable capacitor apparatus according to claim 16, wherein the plurality of capacitors are connected in parallel.

18. The variable capacitor apparatus according to claim 16, wherein two or more capacitors of the plurality of capacitors are variable capacitors according to claim 1 and supply a first drive signal respectively independently to said two or more variable capacitors.

19. The variable capacitor apparatus according to claim 16, wherein the respective two or more capacitors of the plurality of capacitors are variable capacitors according to claim 1, and,
   in at least one of the variable capacitors from among said two or more variable capacitors and at least another one of the variable capacitors from among said two or more variable capacitors, the opposition areas of the first and second electrode parts in the opposing status differ.

20. The variable capacitor apparatus according to claim 16, wherein the respective two or more capacitors of the plurality of capacitors are variable capacitors according to claim 1 and comprise a drive circuit that respectively supplies a first drive signal to said two or more variable capacitors in response to a command signal.

21. The variable capacitor apparatus according to claim 16, wherein the respective two or more capacitors of the plurality of capacitors are variable capacitors according to claim 1, comprised, in at least one of the variable capacitors from among said two or more variable capacitors and at least another one of the variable capacitors from among said two or more variable capacitors, so that the sensitivity of the second drive signal with respect to changes in the gap between at least a part of the first electrode part and the second electrode part in the opposing status varies.

22. A high frequency circuit filter comprising a variable capacitor apparatus according to claim 16.

23. A high frequency circuit comprising a variable capacitor apparatus according to claim 16.

24. A high frequency circuit filter comprising a variable capacitor according to claim 1.

25. A high frequency circuit comprising a variable capacitor according to claim 1.

26. A variable capacitor comprising:
   a fixed part having a first electrode thereon; and
   a moveable part having a second electrode such that the capacity of the variable capacitor is formed between the first and second electrodes,
   wherein in response to a drive signal the moveable part is moved between at least first and second positions, and
   wherein the second electrode opposes the first electrode when the moveable part is in the first position and the second electrode substantially does not oppose the first electrode when the moveable part is in the second position.

* * * * *

UNITED STATES PATENT AND TRADEMARK OFFICE
CERTIFICATE OF CORRECTION

| | | |
|---|---|---|
| PATENT NO. | : 7,881,038 B2 | |
| APPLICATION NO. | : 12/457698 | |
| DATED | : February 1, 2011 | |
| INVENTOR(S) | : Madoka Nishiyama | |

It is certified that error appears in the above-identified patent and that said Letters Patent is hereby corrected as shown below:

Column 23, Line 30, In Claim 13, after "by" delete "of".

Signed and Sealed this
Thirteenth Day of September, 2011

David J. Kappos
*Director of the United States Patent and Trademark Office*